(12) United States Patent
Samsavar et al.

(10) Patent No.: US 7,248,062 B1
(45) Date of Patent: Jul. 24, 2007

(54) CONTACTLESS CHARGE MEASUREMENT OF PRODUCT WAFERS AND CONTROL OF CORONA GENERATION AND DEPOSITION

(75) Inventors: Amin Samsavar, San Jose, CA (US); John M. Schmidt, Oakland, CA (US); Rainer Schierle, Los Altos, CA (US); Gregory S. Horner, Santa Clara, CA (US); Thomas G. Miller, Sunnyvale, CA (US); Zhiwei Xu, Sunnyvale, CA (US); Xiaofeng Hu, Richardson, TX (US); Jianou Shi, Milpitas, CA (US); Sergio Edelstein, Los Gatos, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 77 days.

(21) Appl. No.: 10/701,112

(22) Filed: Nov. 4, 2003
(Under 37 CFR 1.47)

Related U.S. Application Data

(60) Provisional application No. 60/423,639, filed on Nov. 4, 2002.

(51) Int. Cl.
*G01R 31/26* (2006.01)
(52) U.S. Cl. ...................... 324/750; 324/765
(58) Field of Classification Search ........ 324/750–765, 324/767–769, 500–501, 158.1; 250/492.2, 250/492.21, 492.1; 382/141, 145
See application file for complete search history.

(56) References Cited

U.S. PATENT DOCUMENTS 3,495,269 A    2/1970  Mutschler et al.
3,496,352 A    2/1970  Jugle
4,326,165 A *  4/1982  Szedon ....................... 324/765
4,599,558 A    7/1986  Castellano et al.
4,734,721 A    3/1988  Boyer et al.

(Continued)

FOREIGN PATENT DOCUMENTS

WO    98/57358    12/1998

(Continued)

OTHER PUBLICATIONS

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

(Continued)

*Primary Examiner*—Vinh P. Nguyen
(74) *Attorney, Agent, or Firm*—Baker & McKenzie LLP

(57) ABSTRACT

Systems and methods for determining a property of a specimen are provided. The specimen may be a product wafer. The method may include biasing a focused spot on the specimen. The method may also include measuring a parameter of a measurement spot on the specimen. The measurement spot may overlap the focused spot. In addition, the method may include determining the property of the specimen from the measured parameter. Systems and methods for varying the performance of a corona source are also provided. The method may include altering a property of the environment within the corona source. The property may include, but is not limited to, temperature, pressure, humidity, and/or partial pressure of a gas within the corona source.

19 Claims, 14 Drawing Sheets

U.S. PATENT DOCUMENTS

| | | | |
|---|---|---|---|
| 4,812,756 A * | 3/1989 | Curtis et al. ............... 324/750 |
| 5,008,617 A * | 4/1991 | Czubatyj et al. ............ 324/750 |
| 5,023,561 A * | 6/1991 | Hillard ...................... 324/719 |
| 5,220,277 A * | 6/1993 | Reitinger .................... 324/754 |
| 5,485,091 A | 1/1996 | Verkuil |
| 5,498,974 A * | 3/1996 | Verkuil et al. .............. 324/767 |
| 5,500,607 A * | 3/1996 | Verkuil ...................... 324/761 |
| 5,594,247 A | 1/1997 | Verkuil et al. |
| 5,644,223 A | 7/1997 | Verkuil |
| 5,650,731 A | 7/1997 | Fung |
| 5,661,408 A * | 8/1997 | Kamieniecki et al. ...... 324/765 |
| 5,742,658 A | 4/1998 | Tiffin et al. |
| 5,767,691 A * | 6/1998 | Verkuil ...................... 324/761 |
| 5,767,693 A * | 6/1998 | Verkuil ...................... 324/767 |
| 5,773,989 A | 6/1998 | Edelman et al. |
| 5,834,941 A | 11/1998 | Verkuil |
| 5,852,232 A | 12/1998 | Samsavar et al. |
| 5,866,806 A | 2/1999 | Samsavar et al. |
| 5,948,972 A | 9/1999 | Samsavar et al. |
| 5,955,661 A | 9/1999 | Samsavar et al. |
| 6,011,404 A | 1/2000 | Ma et al. |
| 6,060,709 A | 5/2000 | Verkuil et al. |
| 6,072,320 A | 6/2000 | Verkuil |
| 6,091,257 A | 7/2000 | Verkuil et al. |
| 6,097,196 A | 8/2000 | Verkuil et al. |
| 6,104,206 A | 8/2000 | Verkuil |
| 6,121,783 A | 9/2000 | Horner et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,224,638 B1 | 5/2001 | Jevtic et al. |
| 6,267,005 B1 | 7/2001 | Samsavar et al. |
| 6,569,691 B1 | 5/2003 | Jastrzebski et al. |
| 6,759,255 B2 | 7/2004 | Xu et al. |
| 2006/0022698 A1 * | 2/2006 | Eom et al. ................... 324/765 |

FOREIGN PATENT DOCUMENTS

WO     WO 01/29568     4/2001

OTHER PUBLICATIONS

Miller, "A New Approach for Measuring Oxide Thickness," Semiconductor International, Jul. 1995, pp. 147-148.

*Numerical Recipies in C. The Art of Scientific Computing, 2nd Ed.*, © Cambridge University Press 1988, 1992, p. 683.

Weinberg, "Tunneling of Electrons from Si into Thermally Grown $SiO_2$," Solid-State Electronics, 1977, vol. 20, pp. 11-18.

Verkuil, "Rapid Contactless Method for Measuring Fixed Oxide Charge Associated with Silicon Processing," IBM Technical Disclosure Bulletin, vol. 24, No. 6, 1981, pp. 3048-3053.

"Contactless Photovoltage vs. Bias Method for Determining Flat-Band Voltage," IBM Technical Disclosure Bulletin, vol. 32, vol. 9A, 1990, pp. 14-17.

"Contactless Electrical Equivalent Oxide Thickness Measurement," IBM Technical Disclosure Bulletin, vol. 29, No. 10, 1987, pp. 4622-4623.

Schroder, "Surface voltage and surface photovoltage: history, theory and applications," Measurement Science and Technology, vol. 12, 2001, pp. R16-31.

\* cited by examiner

US 7,248,062 B1

CONTACTLESS CHARGE MEASUREMENT OF PRODUCT WAFERS AND CONTROL OF CORONA GENERATION AND DEPOSITION

PRIORITY CLAIM

This application claims priority to U.S. Provisional Application No. 60/423,639 entitled "Contactless Charge Measurement of Product Wafers and Control of Corona Generation and Deposition," filed Nov. 4, 2002.

BACKGROUND OF THE INVENTION

1. Field of the Invention

The present invention generally relates to systems and methods for determining a property of a specimen and systems and methods for varying the performance of a corona source. Certain embodiments relate to systems and methods for determining a property of a product wafer.

2. Description of the Related Art

Fabricating semiconductor devices such as logic and memory devices may typically include processing a substrate such as a semiconductor wafer using a number of semiconductor fabrication processes to form various features and multiple levels of the semiconductor devices. For example, insulating (or dielectric) films may be formed on multiple levels of a substrate using deposition processes such as chemical vapor deposition ("CVD"), physical vapor deposition ("PVD"), and atomic layer deposition ("ALD"). In addition, insulating films may be formed on multiple levels of a substrate using a thermal growth process. For example, a layer of silicon dioxide may be thermally grown on a substrate by heating the substrate to a temperature of greater than about 700° C. in an oxidizing ambient such as $O_2$ or $H_2O$. Such insulating films may electrically isolate conductive structures of a semiconductor device formed on the substrate.

Measuring and controlling such insulating films may be an important aspect of semiconductor device manufacturing. A number of techniques are presently available for making such measurements. For example, electrical measurement techniques, which rely on physical contact to a conductive electrode on top of an insulating film, are able to determine relevant electrical properties of insulating films using capacitance vs. voltage ("C-V") and current vs. voltage ("I-V") measurements. Such measurements have a long history and established utility. These measurements, however, may require a conductive electrode and a contacting probe. The necessity of direct physical electrical contact is particularly undesirable in many manufacturing situations.

Non-contacting electrical test techniques have been developed to provide electrical capacitance, electrical thickness, and electrical conductivity information about insulating films. Non-contacting electrical measurements of dielectric properties have a unique advantage of providing electrically derived information without the requirement of physical contact to an electrode on top of an insulating film. These techniques typically use an ion generation source such as a corona source, and a non-contacting voltage measurement sensor such as a Kelvin Probe or a Monroe Probe to determine electrical properties of the films. Examples of such techniques are illustrated in U.S. Pat. No. 5,485,091 to Verkuil, U.S. Pat. No. 5,594,247 to Verkuil et al., U.S. Pat. No. 5,767,693 to Verkuil, U.S. Pat. No. 5,834,941 to Verkuil, U.S. Pat. No. 6,060,709 to Verkuil et al., U.S. Pat. No. 6,072,320 to Verkuil, U.S. Pat. No. 6,091,257 to Verkuil et al., U.S. Pat. No. 6,097,196 to Verkuil et al., U.S. Pat. No. 6,104,206 to Verkuil, U.S. Pat. No. 6,121,783 to Homer et al., U.S. Pat. No. 6,191,605 to Miller et al., and U.S. Pat. No. 6,202,029 to Verkuil et al., which are incorporated by reference as if fully set forth herein. Commercially available systems configured to perform non-contacting electrical test techniques include Quantox systems available from KLA-Tencor Corporation, San Jose, Calif.

Although such techniques are non-contacting, such techniques are often performed on monitor wafers. The term "monitor wafer" is generally used to refer to a wafer that is processed prior to processing one or more product wafers, or a "lot" of product wafers. The term "product wafer" is generally used to refer to a wafer that is processed using a number of semiconductor fabrication processes to form multiple semiconductor devices thereon. In contrast, a monitor wafer is typically only processed in a single semiconductor fabrication process and then recycled or discarded. As such, semiconductor devices are not formed on monitor wafers. Various measurements of the monitor wafer may also be performed prior to processing the lot. The measurements of the monitor wafer may be used to assess the performance of the process. In this manner, the process may be evaluated and potentially altered prior to processing the lot. Therefore, such a method may increase the probability that the process will be within process limits when product wafers are processed.

As the value of semiconductor wafers increases, and the demand for better throughput and more efficient tool usage increases, methods that utilize monitor wafers are becoming increasing undesirable. For example, methods that include processing and measuring a monitor wafer require materials and labor to create and measure the monitor wafer thereby increasing manufacturing costs and reducing throughput. In addition, measurements performed on monitor wafers may not accurately reflect properties of product wafers for a number of reasons. For example, monitor wafers and product wafers may have different characteristics prior to a process that may affect the properties of the wafers after the process. Such characteristics may include, but are not limited to, topography, underlying layers formed on the wafers, and structures formed on the wafers. The characteristics of monitor wafers and product wafers are different because the monitor wafers and the product wafers may be processed differently prior to using the monitor wafers to evaluate a process. For example, the product wafers may be processed using a number of different semiconductor manufacturing processes while a monitor wafer may not be processed using these processes or may be processed using only a subset of these processes. Therefore, a process may not be accurately evaluated and potentially altered using measurements taken on a monitor wafer.

The systems and methods described above may use a corona source in uncontrolled ambient conditions. Corona sources have been used in such uncontrolled ambient conditions for many years and in various processes. For example, corona technology has long been used in xerographic processes such as photocopying and laser printing. The level of corona control required by and used in such applications is only driven by the need to transfer toner particles. This transfer mechanism is relatively insensitive to the level of corona, the species of corona being produced, and the production of byproduct species. In an additional example, electrostatic precipitators commonly use the corona process as part of a pollution control technology. These corona applications are typically relatively large scale in nature and the industrial applications for which they are designed are also relatively insensitive to the level of corona, the species of corona being produced, and the production of byproduct species. Examples of corona sources are illustrated in U.S. Pat. No. 3,495,269 to Mutschler et al., U.S. Pat. No. 3,496,352 to Jugle, and U.S. Pat. No. 4,734,721 to Boyer et al, which are incorporated by reference as if fully set forth herein.

As described above, non-contacting electrical test methodologies have been developed, which make use of corona sources as a means of depositing charge on the surface of a semiconductor wafer. Examples of corona sources for such methodologies are illustrated in U.S. Pat. No. 5,485,091 to Verkuil, U.S. Pat. No. 5,594,247 to Verkuil et al., and U.S. Pat. No. 5,644,223 to Verkuil, which are incorporated by reference as if fully set forth herein. This application may be commonly referred to as semiconductor metrology. This particular application of corona technology is sensitive to variations in corona deposition and contamination from corona deposition. Corona generation in ambient conditions, however, may produce a number of undesirable byproducts. Such byproducts may include, but are not limited to, ozone, ammonium nitride, and nitric acid. In addition, the electric fields and high voltages may attract particulates into the vicinity of the corona source. In a conventional corona distribution system, such byproducts and particulates may accumulate over time and may deposit onto a wafer and/or change the production of species being created. Therefore, such byproducts and particulates may reduce the accuracy of measurements taken on a semiconductor wafer using a corona source, the accuracy of alterations made to a process using such measurements, and the yield of semiconductor manufacturing processes monitored and altered using a corona source.

SUMMARY OF THE INVENTION

An embodiment of the invention relates to a non-contact method for determining a property of a specimen. The specimen may be a product wafer. The method may include biasing a focused spot on the specimen. The method may also include measuring a parameter of a measurement spot on the specimen. The measurement spot may overlap the focused spot. In an embodiment, the method may include optically locating a predetermined measurement site on the specimen such that the focused spot and the measurement spot on the specimen may be positioned proximate the predetermined measurement site. In addition, the method may include determining the property of the specimen from the measured parameter.

In an embodiment, biasing the focused spot may include focusing a corona source on the focused spot to deposit a charge on a surface of the specimen within the focused spot. Alternatively, or additionally, biasing the focused spot may include focusing light on the focused spot to generate a photovoltage within the focused spot. In an embodiment, the focused spot may have a lateral dimension approximately equal to a lateral dimension of a gate to be formed on the specimen. In an additional embodiment, the focused spot may have a lateral dimension selected such that the biasing does not leak into a device area on the specimen. In a further embodiment, the focused spot may have a lateral dimension less than a scribe line area spaced from a device area on the specimen. For example, the focused spot may have a lateral dimension of approximately 50 µm. Furthermore, the focused spot may have a lateral dimension greater than a lateral dimension of a measurement spot such that the measurement spot may have a substantially uniform bias. In an embodiment, measuring the parameter may include measuring the parameter with a probe having a tip. The tip of the probe may have a radius that may be reproducibly controlled.

In an embodiment, biasing the focused spot and measuring the parameter may be performed subsequent to disposing the specimen within a process tool and prior to removing the specimen from the process tool. In this manner, the method may be performed during a process performed in the process tool. The process may include a number of process steps. In an embodiment, biasing the focused spot and measuring the parameter may be performed between process steps performed in the process tool. In an additional embodiment, biasing the focused spot and measuring the parameter may be performed during a process step performed in the process tool. Alternatively, biasing the focused spot and measuring the parameter may be performed prior to disposing the specimen within a process tool or subsequent to removing the specimen from a process tool. In this manner, the method may be performed before or after a process performed in a process tool.

In an embodiment, the method may further include altering a parameter of a process tool in response to the property using a feedback control technique, a feedforward control technique, and/or an in situ control technique. The method may also include generating an output signal if the property is outside of a predetermined range for the property.

In an additional embodiment, the method may be performed in a first system. The method may also include determining an additional property of the specimen with a second system and determining a relationship between the property and the additional property. In a further embodiment, the method may include processing the specimen subsequent to determining the property of the specimen. Such an embodiment may also include determining an additional property of the specimen subsequent to processing of the specimen and determining a relationship between the property and the additional property. The method may further include additional steps as described herein.

An additional embodiment relates to a system configured to perform a non-contact method for determining a property of a specimen. The specimen may be a product wafer. The system may include a focused biasing device configured to provide a stimulus to a focused spot on the specimen. The focused spot may have a lateral dimension as described herein. The system may also include a sensor configured to measure a parameter of a measurement spot on the specimen. The measurement spot may overlap the focused spot. In an embodiment, the sensor may include a probe having a tip. The tip of the probe may have a radius that may be reproducibly controlled. In addition, the system may include a processor configured to determine the property of the specimen from the measured parameter. In an additional embodiment, the system may include optics configured to locate a predetermined measurement site on the specimen such that the focused spot and the measurement spot may be positioned proximate the predetermined measurement site.

In an embodiment, the focused biasing device may include a focused corona source. For example, the focused biasing device may include a corona source coupled to a conductive mask positioned external to the corona source. The mask may be configured to focus a stimulus provided by the corona source to the focused spot. In an additional embodiment, the focused biasing device may include a focused light source configured to generate a photovoltage within the focused spot. In a further embodiment, the system may include two or more focused biasing devices, which may include one or more focused corona sources and one or more focused light sources. Such a system may also include one or more sensors.

In an embodiment, the system may be coupled to a process tool. For example, the focused biasing device may be configured to provide a stimulus to the focused spot between process steps performed in a process tool. The sensor may also be configured to measure the parameter between process steps performed in the process tool. In an additional example, the focused biasing device may be configured to provide the stimulus to the focused spot during a process step performed in a process chamber of the process tool. The sensor may also be configured to measure the parameter during the process step. In an additional embodiment, the focused biasing device and the sensor may be disposed within a measurement chamber coupled to a process tool. In a further embodiment, the system may include one or more measurement chambers coupled to a process tool. The focused biasing device and the sensor may be disposed within the one or more measurement chambers. In an alternative embodiment, the system may be a stand alone system.

In an embodiment, the processor may be configured to alter a parameter of a process tool in response to the property using a feedback control technique, a feedforward control technique, and/or an in situ control technique. In an additional embodiment, the processor may be configured to generate an output signal if the property is outside of a predetermined range for the property.

In a further embodiment, the processor may be configured to determine a relationship between the property and an additional property of the specimen. The additional property may be determined with an additional system. In addition, or alternatively, the property may be determined prior to a process step, and the additional property may be determined subsequent to the process step. The various embodiments described above may be further configured as described herein.

The various embodiments of systems and methods for determining a property of a specimen described herein may provide several advantages over currently available systems and methods. For example, the systems and methods described above may be used to determine a property of a product wafer. As such, the number of monitor wafers that must be produced for testing during semiconductor device fabrication may be reduced. Reducing the number of monitor wafers that are produced for testing may increase throughput and efficiency of process tool usage and may reduce fabrication costs and fabrication time by reducing the materials and labor required to produce such monitor wafers. In addition, monitor wafers are often produced separately from product wafers. Therefore, monitor wafers may have different properties than product wafers. As such, determining a property of a product wafer, as opposed to a monitor wafer, may increase the accuracy of such systems and methods. Furthermore, using the systems and methods as described herein to alter a parameter of a process tool may increase the accuracy of such alterations due to the increased accuracy of the determined parameters. As such, the systems and methods as described herein may provide tighter process control, increased overall yield, increased yield of higher performance devices, and reduced fabrication costs than currently available systems and methods.

A further embodiment relates to a method for varying the performance of a corona source. The method may include altering a property of the environment within the corona source. The property may include, but is not limited to, temperature, pressure, humidity, and/or partial pressure of a gas within the corona source. In an embodiment, altering the property may include introducing one or more gases through a mixing chamber and a showerhead distributor. In an additional embodiment, altering the property may include removing one or more gases from the corona source through an opening within the corona source. In a further embodiment, altering the property may include removing one or more gases from the corona source through a tube coupled to an opening within the corona source. Such an embodiment may also include separating one or more species from the one or more gases within the tube. In an additional embodiment, altering the property may include reducing gas flow rates into and out of the corona source during charge deposition by the corona source. In an embodiment, altering the property may include gettering one or more species from the environment within the corona source.

An additional embodiment of a method for varying the performance of a corona source may include altering a parameter of the environment within a measurement chamber in which the corona source is disposed. In a further embodiment, a method for varying the performance of a corona source may include depositing a charge from the corona source onto a specimen and flowing a gas external to the corona source proximate the specimen. In addition, an embodiment of a method for varying the performance of a corona source may include depositing a charge from the corona source onto a specimen through an aperture in the corona source and, subsequent to depositing the charge, moving a shutter over the aperture to reduce deposition of undesired species onto the specimen. A further embodiment of a method for varying the performance of a corona source may include depositing a charge from the corona source onto a specimen, measuring a parameter of the specimen in response to the charge deposited on the specimen with a sensor, and removing one or more gases proximate the sensor to reduce deposition of corona byproducts onto the sensor.

An additional embodiment relates to a system that includes a corona source configured to deposit a charge onto a specimen. The system may also include an environmental control unit configured to alter a property of the environment within the corona source. The property may include, but is not limited to, temperature, pressure, humidity, and partial pressure of a gas within the corona source. The corona source may also be disposed within a measurement chamber. In an embodiment, the environmental control unit may also be configured to alter a property of the environment within the measurement chamber.

A further embodiment relates to a system that includes a corona source configured to deposit a charge onto a specimen. The system may also include a control device configured to alter an amount of one or more gases within the corona source. In an embodiment, the control device may include, but is not limited to, a mass flow controller, a pressure control valve, a vacuum source, or a controllable valve. In an alternative embodiment, the control device may include a mixing chamber coupled to a showerhead distributor. In a further embodiment, the control device may include a tube coupled to an opening in the corona source. In such an embodiment, the control device may be configured such that the one or more gases flow into the tube from the corona source. In addition, the tube may be grounded such that one or more species may be separated from the one or more gases. Alternatively, the tube may include a gettering material such that one or more species may be separated from the one or more gases. In an additional embodiment, the control device may be configured to reduce gas flow rates into and out of the corona source during charge deposition by the corona source. Furthermore, the corona source may be disposed within a measurement chamber. In an embodiment, the control device may be configured to alter an amount of one or more gases within the measurement chamber. The system may also include one or more control devices and/or an environmental control unit as described above.

An additional embodiment relates to a corona source that includes a gettering material. The gettering material may be configured to remove one or more species from the environment within the corona source. In an embodiment, the one or more species may include ozone. The system may also include one or more control devices and/or an environmental control unit as described above.

A further embodiment relates to a system that includes a corona source configured to deposit a charge onto a specimen. The system may also include a gas flow device configured to alter a flow of one or more gases external to the corona source and proximate to the specimen. In addition, the gas flow device may be configured to alter the flow of one or more gases such that the flow of the one or more gases may be substantially laminar. The system may also include one or more gas flow devices, additional devices, control units, and/or gettering materials as described above.

An additional embodiment relates to a system that includes a corona source configured to deposit a charge onto a specimen through an aperture in the corona source. The system may also include a shutter coupled to the corona source. The shutter may be configured to be moved over the aperture during periods of time when charge is not being deposited onto the specimen to reduce deposition of undesired species onto the specimen. The system may also include additional devices, control units, and/or gettering materials as described above.

A further embodiment relates to a system that includes a corona source configured to deposit a charge onto a specimen. The system may also include a sensor configured to measure a parameter of the specimen in response to the charge deposited on the specimen. In addition, the system may include a gas flow device configured to remove one or more gases proximate the sensor to reduce deposition of corona byproducts onto the sensor. The system may also include additional devices, control units, and/or gettering materials as described above. The embodiments described above may be further configured as described herein.

The various embodiments of systems and methods for varying the performance of a corona source by altering a property of the environment within a corona source described herein may provide several advantages over currently available systems and methods that include operating a corona source in a substantially uncontrolled ambient environment. Controlling the environment of a corona source may increase control of the charged species being produced by the corona source and reduce production and accumulation of undesired "byproduct" species, which may be unintentionally produced as part of the corona generation process. Examples of such species may include, but are not limited to, ozone, ammonium nitride, and nitric acid. Therefore, the systems and methods described herein may reduce deposition of the particulates onto a specimen such as a product wafer. In addition, the systems and methods described herein may reduce deposition onto a corona target source thereby reducing undesired alteration of corona production and deposition. Therefore, systems and methods as described herein may provide increased accuracy of measurements of the properties of specimen and increased accuracy of process alterations based on such measurements.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
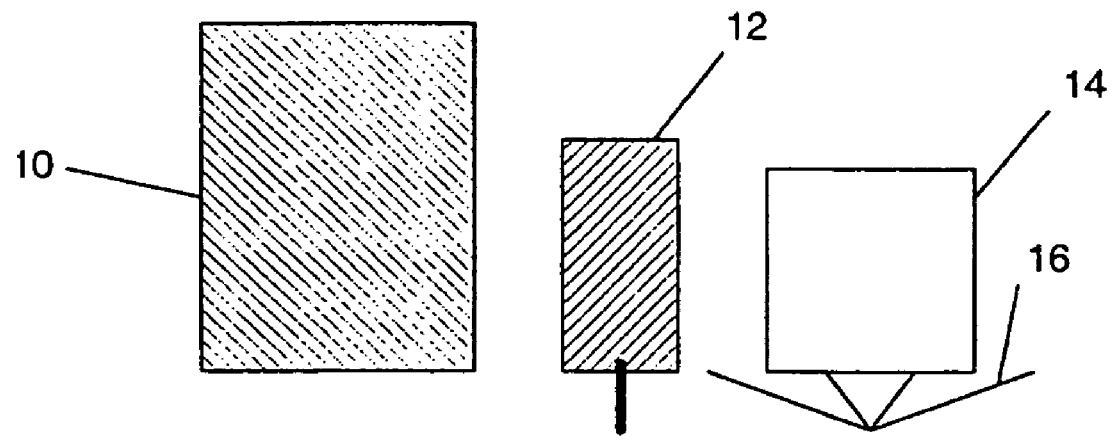
FIGS. 1–3 depict schematic side views of various embodiments of a measurement head of a system configured to determine a property of a specimen.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The following description generally relates to systems and method for determining a property of a specimen such as a product wafer and systems and methods for altering the performance of a corona source. The properties may be electrical and physical properties. The specimen may also include an insulating (or dielectric film) formed on a substrate such as a semiconductor wafer. A system configured, in accordance with various embodiments described herein, to determine a property of a semiconductor product wafer may be referred to hereinafter as a "product wafer Quantox system." A product wafer Quantox system uses a non-contact methodology to study electrical properties of a device formed on a product wafer. This methodology may be performed by providing an electrical and/or light stimulus to the specimen and measuring the response of the specimen with a sensor. Embodiments of the methodology relate to measurement of electrical performance on a product wafer as opposed to a monitor wafer. Additional embodiments of the methodology relate to correlation of the electrical performance of a specimen as measured by the disclosed methodology with other electrical testing systems and methods that may be used to measure properties of monitor wafers or may be performed at later stages of semiconductor device fabrication processing steps.

An embodiment of a product wafer Quantox system may include a plurality of subsystems that may include, for example, a frame and an enclosure, a handler configured for wafer handling and introduction, a stage and motion system configured for wafer positioning and alignment, a chuck assembly, a "z" approach system, a vibration isolation system, an electronics data acquisition system and associated software, a processor or a computer system and a monitor, environmental controls, a particle reduction system, optical systems and pattern recognition, a measurement sensor and a biasing device. The measurement sensor and the biasing device may be incorporated into a subsystem, which will be referred to hereinafter as a "measurement head." A measurement head as described herein may be integrated into any measurement system or processing chamber of a process tool. In this manner, the system may include a stand alone system or may be coupled to a process tool as further described herein. In addition, one or more measurement heads may be incorporated into a system or one or more process chambers of a process tool. The one or more measurement heads may be configured differently or similarly. For example, the one or more measurement heads may be configured to determine a property of a specimen using a focused corona device, a focused light source, and/or a focused corona device and a focused light source.

Figure 2:
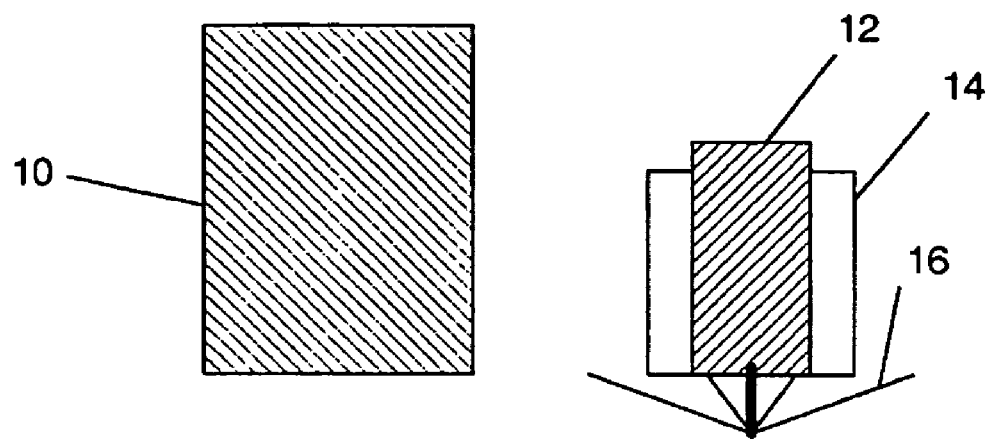

Turning now to the drawings, FIGS. 1 and 2 illustrate schematic side views of embodiments of a measurement head of a system configured to determine a property of a specimen. As shown in FIGS. 1 and 2, a measurement head may include optics system 10, focused biasing device 12, sensor 14, and focused biasing device 16. As further shown in FIG. 1, focused biasing device 12 may be separate from sensor 14. Alternatively, as shown in FIG. 2, focused biasing device 12 may be integrated with sensor 14. In addition, a measurement head may include only focused biasing device 12 or focused biasing device 16. Furthermore, a measurement head may include one or more focused biasing devices 12 and/or one or more focused biasing devices 16. A measurement head may also include one or more sensors 14. One or more sensors may be used to reduce lateral dimensions, or a "footprint," of the system. For example, multiple sensors may be configured to measure a parameter of the specimen at multiple locations on the specimen with reduced x-y positioning of the specimen and the probes relative to each other.

Optics system 10 may be configured to locate objects on a specimen (not shown) such as structures formed on the specimen. For example, optics system 10 may be configured to provide pattern recognition capability to locate predetermined measurement sites or measurement sites of interest. In this manner, the optics system may be used to position a focused spot of a focused biasing device and a measurement spot of a sensor proximate the predetermined measurement site. Optics system 10 may also be configured to provide auto-focusing capability such that positions of the focused biasing devices, sensor 14, and/or the specimen may be altered to focus the specimen. The optics system may include fiber bundles for light delivery from a light source to the specimen for viewing and/or include fiber bundles to transfer an image of the specimen outside of a chamber of the system. The optics system may have one or multiple magnification options.

Focused biasing devices 12 and 16 may be configured to provide a stimulus to a focused spot on a specimen. The focused biasing devices may include one or more different sources. Some of these biasing methods may be built into sensor 14 as shown in FIG. 2, or may be separate from sensor 14 as shown in FIG. 1. For example, a scanning probe microscope such as a scanning tunneling microscope may include a tip that be configured as a sensor as well as a biasing device. Examples of appropriate focused biasing devices include, but are not limited to, an e-beam device, an ion beam device, a corona source, a bias plate, and a light source configured to generate a photovoltage. In an embodiment, focused biasing device 12 may include a focused corona source configured to deposit a charge within a focused spot on the specimen, or to bias a focused spot on a surface of a dielectric material formed on a specimen. Focused biasing device 16 may include a focused light source configured to generate a photovoltage within a focused spot on the specimen. The term "focused spot" as used herein generally refers to the area on the specimen in which a biasing may be generated by a focused biasing device. Focused biasing device 12 and focused biasing device 16 may be further configured as described herein.

Sensor 14 may include any sensor configured to measure a parameter of a measurement spot on the specimen. The measurement spot may overlap the focused spot. In this manner, sensor 14 may be configured to measure a parameter of the specimen such as a potential or a photovoltage generated by one or more of the focused biasing devices described above. Examples of appropriate sensors include, but are not limited to, a Kelvin probe, a Monroe probe, a Scanning Capacitance Probe, a Scanning Probe Microscope, an Electrostatic Force Microscope (EFM), a Capacitance sensor, an Eddy Current sensor, a Scanning tunneling microscope, and a Secondary emission of electrons sensor. In addition, sensor 14 may be a Kevin Force Probe based on an Electrostatic Force Detector as described herein. The sensor may also include any sensor that may detect an electrical signal of a specimen generated by a focused biasing device described above.

Figure 3:
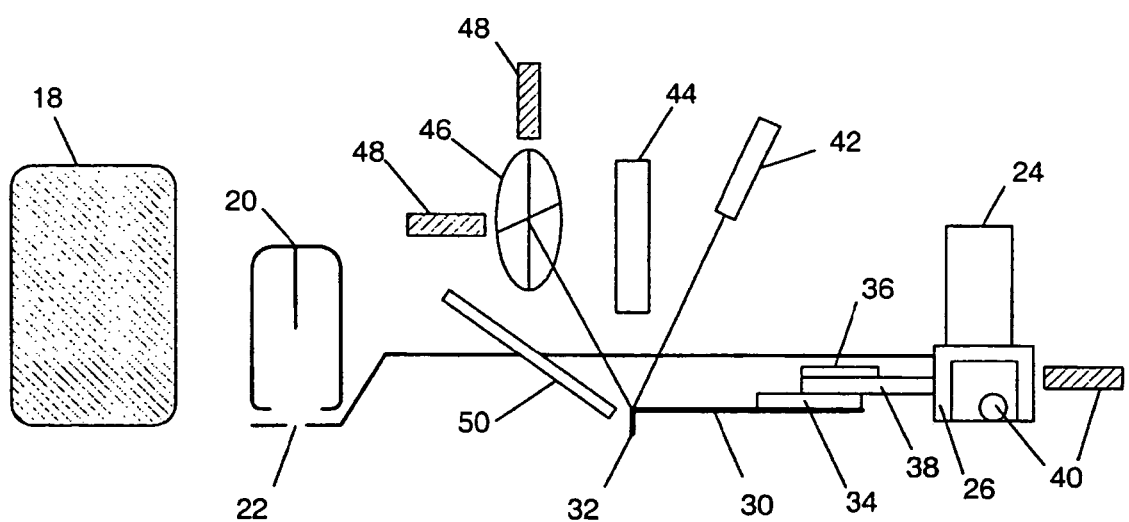

FIG. 3 illustrates another embodiment of a measurement head of a system configured to determine a property of a specimen. The system may optionally include view optics 18. View optics 18 may be configured as dual magnification optics with magnifications of 5× and 15×. The magnification may be changed, however, within a range of 1× to 20×. The view optics may also include a relatively fast auto focus system that may be used for coarse approach. Actuation time may be less than about 0.5 seconds for auto focusing. The dual magnification may be used to perform deskew, as well as pattern recognition. For example, the view optics may include pattern recognition capability to locate structures on a specimen. In this manner, view optics 18 may be configured to locate a predetermined measurement site on a specimen such that a focused spot and a measurement spot may be positioned proximate the predetermined measurement site.

As shown in FIG. 3, the system may also include corona source 20. Corona source 20 may be a high voltage corona source located in relatively close vicinity to a probe of the system. Aperture 22 may be held (and may be biased) in front of the corona source to reduce the spot size of the corona source. In this manner, corona source 20 may be a focused corona source in which the charge generated by the corona source is directed onto a focused spot. The focused spot may have lateral dimensions as described herein. Capacitance coupling of the aperture to the sample may set the gap. The distance setting may be controlled by lift actuator 24. Fine position actuator 26 may be configured to control the relative position between the probe and aperture 22.

The system may also include a sensor, which may include a Kelvin Force Probe based on an Electrostatic Force Detector or any other sensor as described herein. A Kelvin Force Probe is generally known in the art. Basically, the probe is sensitive to surface potential variations. The probe may include an oscillating cantilever 30. Relatively dull tip 32 may coupled to cantilever 30 at a far end of the cantilever. Tip 32 may have a diameter of about 5 μm to about 50 μm. Such a probe may provide advantages over normal Electrostatic Force microscope detectors, which are based on atomic force microscope technology. For example, the tip of an atomic force microscope is required to be extremely sharp. Therefore, a radius of such a tip may not be controlled reproducibly. Alternatively, because a tip of the probe described above is relatively dull, a radius of the tip may be controlled reproducibly. In addition, due to the larger radius of the tip, a better signal to noise ratio may be expected for electrostatic force measurements than measurements of a probe of an atomic force microscope. In an alternative embodiment, the probe may have an elastically deformable conductive tip. An example of such a probe is illustrated is PCT Application No. WO 01/29568 A1 to Mazur et al., which is incorporated by reference as if fully set forth herein.

The other end of the cantilever may be coupled to carrier base 34. The carrier base may be removable and may reside on a kinematical mounted base. The cantilever may also be coupled to bimorph piezoelectric actuator (PZT) 36, which may drive the cantilever at a resonance of, for example, about 100 kHz to about 500 kHz, or about 300 kHz. The probe tip may be arranged proximate to a surface of a specimen. For example, the probe tip may be arranged about 1 μm away from the surface of a specimen. The system may include stacked PZT 38 configured to move the probe away from or towards a specimen.

In addition, the system may include coarse positioning actuators 40 coupled to the cantilever. Coarse actuators 40 may be configured to alter a location laser 42 on the back surface of the cantilever. An example of appropriate coarse actuators may include, but are not limited to, v-focus motors that may be turned off while retaining their location. The system may also include optical viewing system 44, which may provide output signals to actuators 40. For example, optical viewing system 44 may be used to detect a position of the probe relative to the laser and provide an output signal responsive to the relative positions to the actuators. An example of an appropriate optical viewing systems may include an infrared charge-coupled device (CCD) camera, which may be configured to detect light having wavelengths from about 400 nm to about 2 μm. Filters may also be coupled to the camera to select the wavelengths of light that may be detected by the camera. In this manner, optical viewing system 44 and actuators 40 may be used to automatically position the probe to a location under laser 42. Furthermore, by positioning laser 42 on the backside of the cantilever, light from the laser may not impinge upon the cantilever but not upon the specimen. In addition, the cantilever may have a substantially reflective surface such that light from the laser does not pass through the cantilever. For example, the surface of the cantilever may be coated with aluminum.

Upon capacitive coupling of the lip with the surface, the oscillation frequency and phase of movement of the proveprobe may vary. The shift in the oscillation frequency and phase may be proportional to a surface potential of a dielectric material formed on a surface of the specimen. The system may also include detector 46. Detector 46 may be configured to detect light from laser 42 reflected from the back surface of the cantilever. In this manner, the detector may detect changes in the reflected light due to changes in the oscillation frequency and phase of the probe. An appropriate detector may include, but is not limited to, a Quad detector and a piezoresistive element. Coarse positioning actuators 48 may be couple to detector 46. Coarse positioning actuators 48 may be configured to alter a location of detector 46 to increase the detector signal. An example of appropriate coarse positioning actuators may include, for example, v-focus motors which can be turned off while retaining their location. Alternatively, laser 42 and detector 46 may be replaced with a tuning fork. A tuning fork may be configured to measure a shift in position of the cantilever relative to free space due to movement of the cantilever.

The system shown in FIG. 3 may also include focused light source 50. Focused light source 50 may include a laser having a predetermined spot size. Alternatively, focused light source 50 may include any light source known in the art coupled to one or more other optical elements such as lenses. The other optical elements may be configured to alter and/or reduce a spot size of the light source. In this manner, the focused light source may be configured to generate a photovoltage within a focused spot on a specimen. Focused light source 50 may over illuminate the specimen probe junction. The light source may be configured to provide a pulsed or substantially continuous beam of light. Broadband or multiple light sources may be used to deliver multiple frequencies of light to the junction.

The Kelvin Force Probe sensor may be substantially transparent for light wavelengths used for inducing photovoltage effects in the specimen. For example, wavelengths of about 1.3 μm may be selected to induce a photovoltage in the specimen. Therefore, instead of side illumination shown in FIG. 3, the light source may be configured to direct light through Kelvin Force Probe tip 32. In case of either side or top illumination, the probe material or its physical arrangement may be selected such that the probe itself would not be affected by light from light source 50. In this manner, light source 50 may not cause a photovoltage in the probe thereby reducing unwanted biasing of the probe. A timing of the measurement may be selected such that any possible probe self-induced photovoltage effects may be neglected. In addition, selecting a probe material with appropriate doping levels, for example, may control the probe self-induced photovoltage timing. The effects of a probe photovoltage may be modeled, and the effect of this photovoltage on the measurements may be determined. In this manner, the measurement may be corrected for such a photovoltage.

When a system, as described in various embodiments herein, is used to determine a property of a product wafer, the focused spot of each of the focused biasing devices and the measurement spot described above may have a lateral dimension approximately equal to a critical dimension of a semiconductor device to be formed on the product wafer. For example, the critical dimension may be a lateral dimension of a gate to be formed on the product wafer. Alternatively, the product wafer may include test structures, which may have a lateral dimension larger than a lateral dimension of a structure of the semiconductor device. Properties of the test structures determined with the system may be used to estimate properties of structures of semiconductor devices. In this manner, a focused spot and a measurement spot may have a lateral dimension from approximately a lateral dimension of a gate to be formed on the product wafer to multiples of a die size of the product wafer. In addition, a focused spot and a measurement spot may be located in a scribe line area on the product wafer spaced from a device area on the product wafer. The focused spot may also have a lateral dimension selected such that the bias source may not leak into a device area on the product wafer. For example, the focused spot may be located within a scribe line area and may have a lateral dimension smaller than a lateral dimension of the scribe line area on the product wafer. In one example, the focused spot may have a lateral dimension of about 50 μm.

A measurement spot may have a lateral dimension smaller than a lateral dimension of the focused spot. As such, substantially the entire measurement spot may overlap the focused spot. In this manner, the measurement spot may have a substantially uniform biasing. Several combinations of lateral dimensions of the focused spot and the measurement spot, however, are available for use in the systems described herein. For example, a focused spot having a relatively small lateral dimension may be used in combination with a measurement spot having a relatively small lateral dimension. In this manner, substantially the entire measurement spot may overlap the focused spot, or only a portion of the measurement spot may overlap the focused spot depending upon the alignment of the various devices and sensors of the system. Alternatively, a relatively small lateral dimension of a focused spot may be used in combination with a relatively large lateral dimension of a measurement spot. In this manner, only a portion of the measurement spot may overlap substantially the entire focused spot depending upon the alignment of various devices and sensors of the system.

Corona generation in ambient conditions relies on using relatively high electric fields to initiate and maintain the corona ionization process. Presently useful techniques for controlled and self-sustaining corona creation in ambient conditions generally relies on geometrical enhancement of electric field in which regions of relatively high electric field may be achieved in a localized region. Such relatively high electric fields may be achieved by applying a relatively large voltage to a tip or a wire that has a relatively small radius of curvature, relative to counter electrodes. A corona source in any of the embodiments described herein may include one or more needles. At the sharp of the one or more needles, the highest electrical field may be generated thereby generating corona at the center of the sharp or sharps. Alternatively, a corona source may include a wire, and corona may be generated along a length of the wire. In addition, a corona source may include a blade, and corona may be generated along the sharpest edge of the blade.

Figure 4:
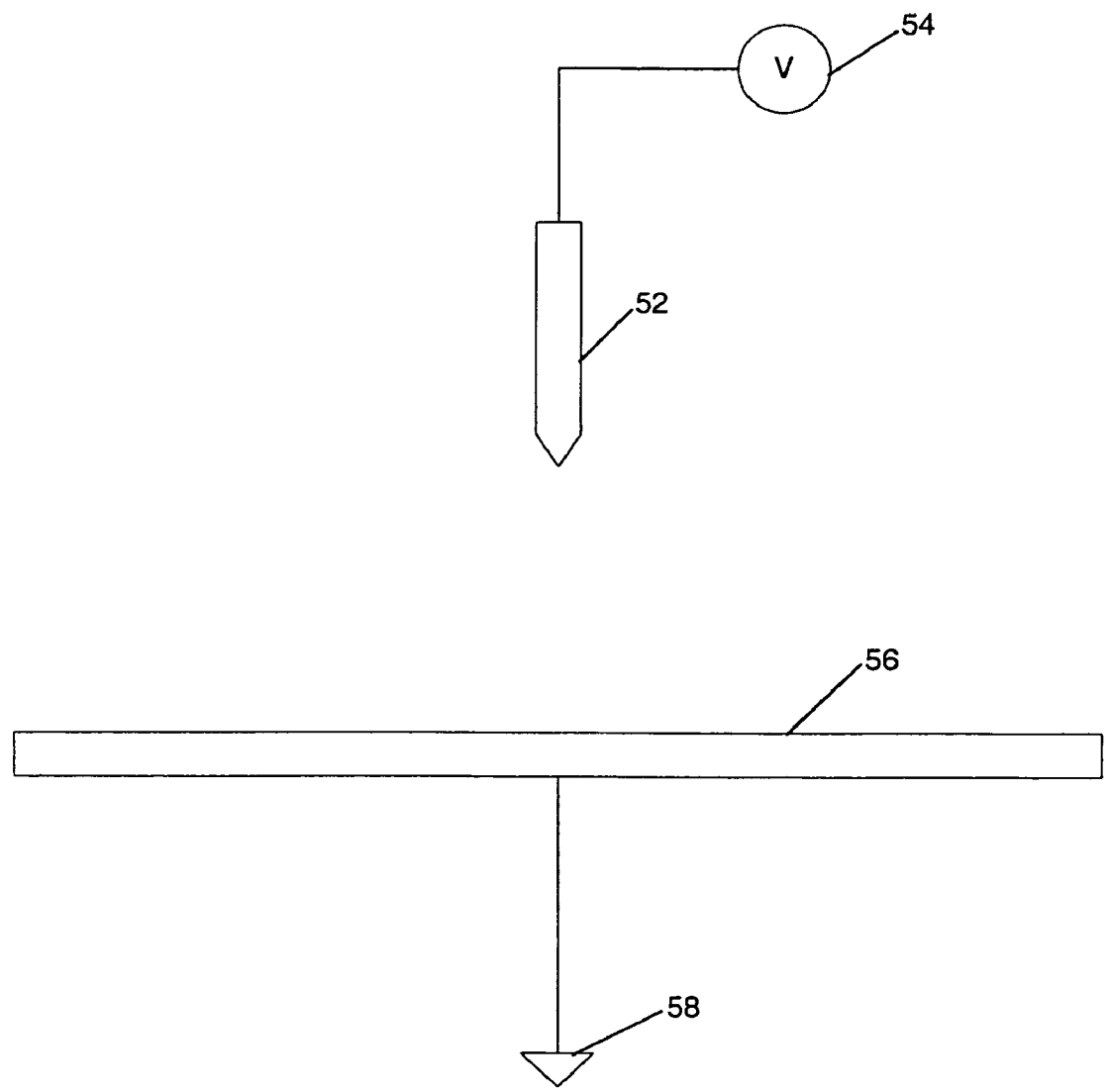
FIG. 4 depicts a schematic side view of an embodiment of a needle geometry for a corona source.

FIG. 4 illustrates a schematic side view of an embodiment of a needle geometry for a corona source. The corona source may include needle 52 coupled to voltage source 54. The needle may be disposed above chuck 56, which may be configured to support a specimen (not shown). Chuck 56 may be a vacuum chuck configured to hold a specimen in place by allowing a vacuum to be pulled through the chuck and onto a backside of the specimen. Chuck 56 may be positioned with respect to needle 52 such that charged species generated by needle 52 may be deposited upon a specimen disposed upon the chuck. Chuck 56 may be coupled to grounding contact 58, which may provide a grounding contact to the specimen. The chuck, or a stage, may be configured to alter a location at which a measurement may be taken on the specimen by moving in x and y directions. Alternatively, the chuck may be configured to move in r and θ directions to alter a location at which the parameter may be measured. In this manner, a system that includes an r/θ stage may have smaller lateral dimensions, or a "footprint," than a system that includes an xy stage.

Figure 5:
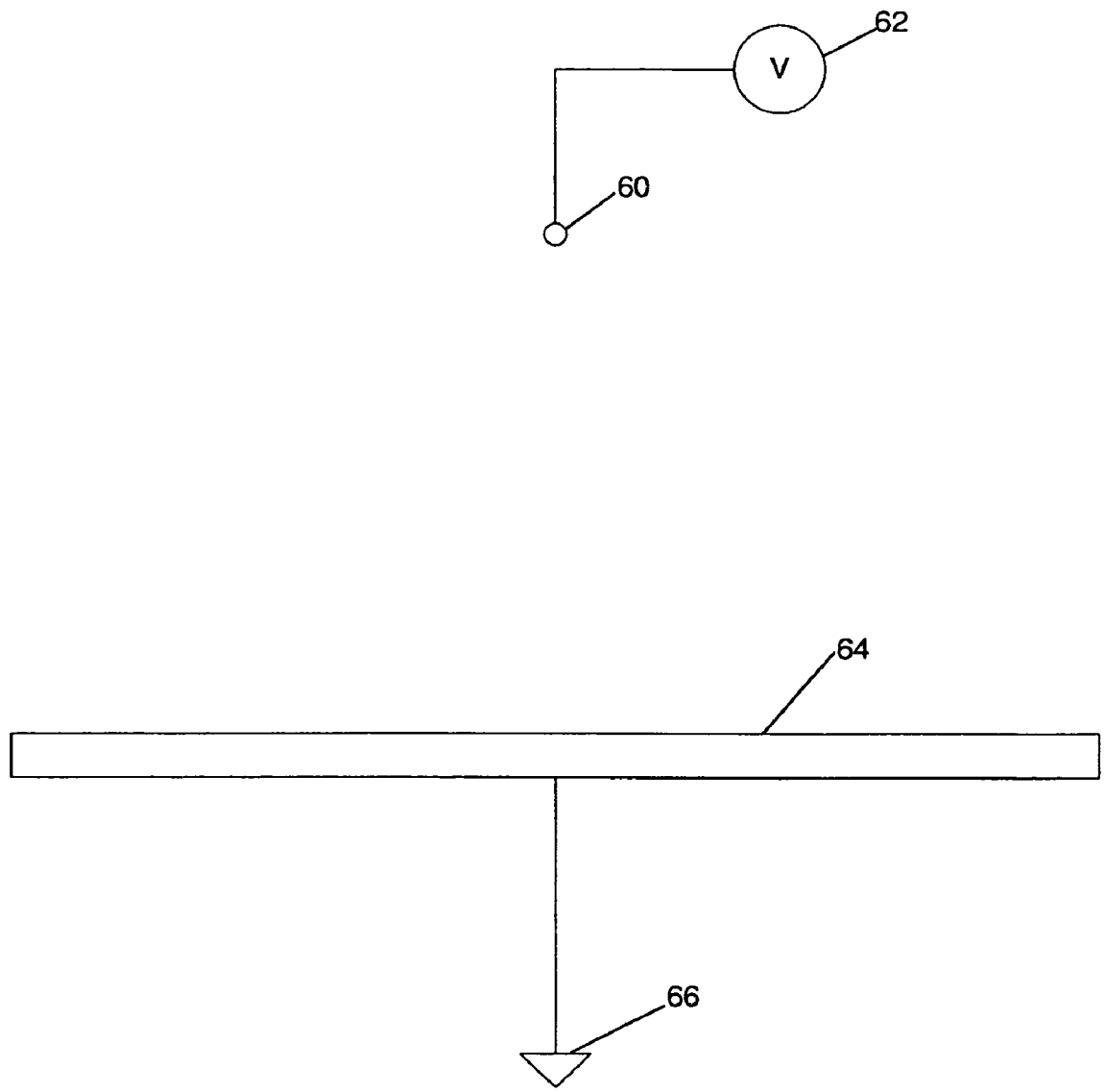
FIG. 5 depicts a schematic side view of an embodiment of a wire geometry for a corona source.

FIG. 5 illustrates a schematic side view of an embodiment of a wire geometry for a corona source. The corona source may include wire 60 coupled to voltage source 62. The wire may be disposed above chuck 64 coupled to grounding contact 66, which may be configured as described above. Other types of corona sources may include multiple wires, multiple needles, and a variety of electrodes surrounding the corona emission region. Further description of embodiments presented herein describe a needle geometry, however, it is to be understood that the embodiments described herein may apply to all geometries of corona sources.

Figure 6:
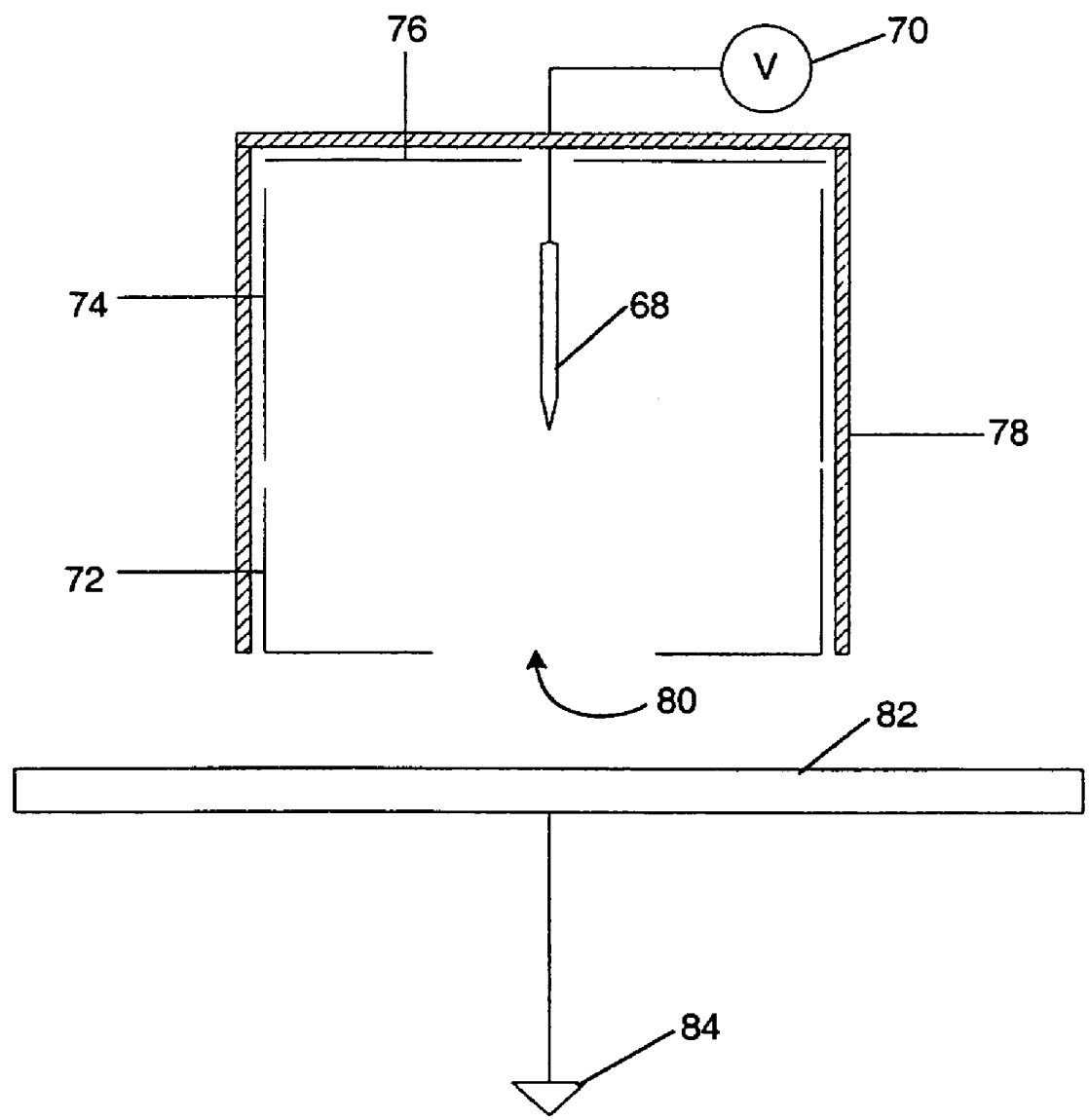
FIG. 6 depicts a schematic side view of an embodiment of a corona source disposed within surrounding surfaces.

In a typical implementation, the corona source may be disposed within a housing, which may include electrically conductive electrodes or insulators. Conductive electrodes may normally be maintained at a known electrical potential. FIG. 6 illustrates an embodiment of a corona source. The corona source may include needle 68 coupled to voltage source 70. The corona source may also include one or more conductive electrodes such as conductive electrodes 72, 74, and 76. Each of the electrodes may be maintained at a different voltage, or each of the electrodes may be maintained at substantially the same voltage. Alternatively, the conductive electrodes may be replaced with insulators. The corona source may also optionally include insulator 78, which may surround the conductive electrodes 72, 74, and 76 (or alternative insulators) and needle 68. In such implementations, corona species may exit the source through opening 80, or deposition aperture, and charged ions may be deposited onto a surface of a specimen disposed proximate the opening. For example, the specimen may be disposed upon chuck 82, which may be coupled to grounding contact 84, and may be further configured as described above.

In a technologically important application, the desired species may be deposited onto the surface of a semiconductor substrate or onto a surface of the uppermost layer of a plurality of layers formed on a semiconductor substrate such as a product wafer. In a typical implementation, charged species may be deposited onto an insulating layer, i.e., silicon dioxide ($SiO_2$), formed on a silicon substrate in the form of wafer typically used in the manufacturing of integrated circuits. Charged species, however, may also be deposited onto substrates formed of other materials such as, but not limited to, germanium and gallium arsenide.

Figure 7A:
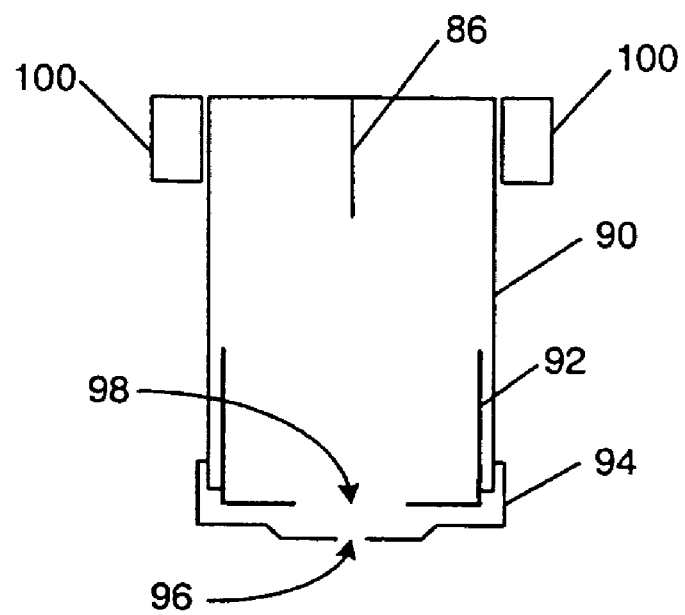
FIG. 7a depicts a cross-sectional side view of an embodiment of a focused corona source.
Figure 7B:
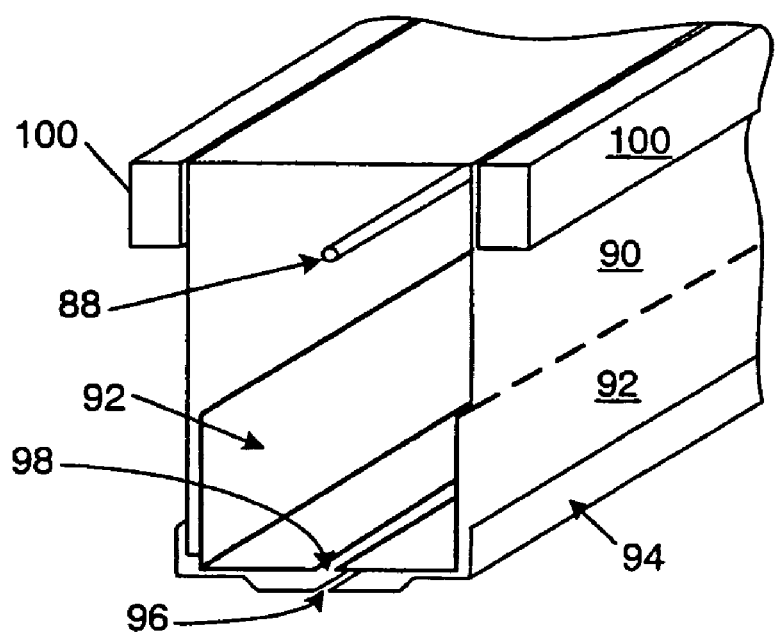
FIG. 7b depicts a perspective view of an embodiment of a focused corona source.

FIG. 7a illustrates a cross-sectional side view of an embodiment of a focused corona source. FIG. 7b illustrates a perspective view of an embodiment of a focused corona source. A corona source may include needle 86 as shown in FIG. 7a or may include wire 88 as shown in FIG. 7b. Other elements of a corona source which are shown in both FIGS. 7a and 7b and may be similarly configured are indicated by the same reference numerals. A wire or needle used in such source may need to be relatively stable and substantially inert to reactions with corona generated species. In addition, the material of the wire or needle may be selected such that the material may not dissociate under the field in which the corona is generated. Examples of appropriate materials for a wire or needle of a corona source include, but are not limited to, tungsten, platinum, platinum-iridium, and silicon.

A corona source may include housing 90. The housing may include conductive electrodes and/or insulators as described above. The corona source may also include mask 92, which may be formed of a conductive material, to provide control for the corona source. Mask 92 may be disposed within housing 90. The corona source may further include external mask 94. External mask 94 may also be formed of a conductive material to provide control for the corona source. External mask 94 may include opening 96, which may form an exit aperture for charged species generated by needle 86 or wire 88.

To the first order, the lowest aperture of a corona source may determine the spot size of the corona. In this manner, opening 96 may have lateral dimensions such that the corona source may deposit a charge within a focused spot on a specimen. Alternatively, external mask 94 may be eliminated from the corona source. In this manner, mask 92 may be the lowest aperture of the corona source. Therefore, opening 98 in mask 92 may determine the spot size of the corona. As such, opening 98 may have lateral dimensions such that the corona source may deposit a charge within a focused spot on a specimen. The focused spot may have lateral dimensions as described herein.

Housing 90, mask 92, and external mask 94 may surround the corona source thereby defining a volume of the environment of the corona source. A property of the environment may be altered by methods and systems as described herein. The corona source may also include gas flow inlets 100. Gas flow inlets 100 may be configured to provide gases into the corona source that may assist in generation of corona species for positive or negative ions. Examples of appropriate gases may include, but are not limited to, air, nitrogen, and carbon dioxide.

An amount of corona generated by a focused corona source may be measured, altered, and/or controlled by incorporating a sensor into or at close vicinity of the corona source. The sensing may include measuring a current to one or more of the elements of the source, or the amount of charge. Based on this measurement, a parameter of the source may be altered using a feedback control technique, a feedforward control technique, and/or an in situ control technique. For example, the measurement or a value of an altered parameter may be fed to a corona source controller, which may be configured to alter a parameter of the corona source. The control techniques may be performed digitally or by analog. Corona deposition may be performed, however, with or without using such a control technique in conjunction with another sensor that may measure a parameter that may indicate the amount of charge deposited onto the specimen.

Calibration of corona deposition by a corona source may be performed periodically with a separate sensor to determine the deposition rate. Using a scale such as a Q-scale, timed bursts of corona may be deposited for an approximate amount of corona deposited. A corona source may be calibrated from a wire source and a corona deposition profile may be developed parallel and perpendicular to the wire. These profiles may be used to estimate the amount and shape of corona deposited. Once the calibration profile of a corona source is determined, software may be used to correct non-uniformities in the charge deposition across a surface of a specimen. For example, a calibration curve may be determined to account for variations in the amount of corona from location to location on a specimen. In this manner, a map of the specimen, which may include values of deposited charge, voltage, and surface photovoltage for various locations spaced across the wafer, may be corrected for variations in the charge depositions. Such a map, therefore, may represent approximately equal charge depositions for the various locations and may indicate variations in the voltage and/or surface photovoltages. Negative and positive biases may have substantially different calibration curves. Therefore, a separate calibrate curve may be determined for each type of bias.

As described above, a corona-based biasing device may require controlled gases to generate corona species for positive or negative ions. The generation of corona in ambient conditions in a conventional implementation of a corona source such as xerographic processes and pollution control processes is controlled sufficiently for these applications. For the application of semiconductor film metrology, however, the implementation of corona sources may be improved. For example, considerably higher control of the rate and species of corona generated may be achieved by controlling the environment within the corona source.

The production of corona may create undesired species, which may be byproducts of corona generation. For example, several byproducts such as ozone and solids created in the form of particulates such as ammonium nitrate may be formed by the chemistry involved in corona generation. Such byproducts may undesirably deposit onto the corona target source. For example, ozone is relatively highly reactive and may coat a surface of a corona source. In addition, accumulation of ozone of the surface may cause the workfunction of the source to change. A change in the workfunction may affect measurements of potential and may offset matching and stability of measurement probes. In most applications, these relatively small changes may not be important, however, for the application of semiconductor metrology, these effects may be significant.

To reduce problems associated with the production of ozone, a corona source may be operated in a substantially steady state mode in which the amount of ozone may be controlled at a level sufficient to saturate shifts of workfunction. In addition, the problems associated with production of ozone may be reduced by controlling the gases involved in corona generation and by replenishing the amounts of gases required to generate corona. Such controlling and replenishing of the gases in a corona source may be performed by controlling the gas flow into and out the corona source. For example, by providing a substantially continuous flow of one or more gases through openings formed in a housing of a corona source, such undesirable byproducts may be removed from the corona source. A reduction in pressure at the outlet of the housing via vacuum or some other mechanism such as diffusion may provide removal of these byproducts. For example, a corona source may include a relatively large opening or a large unused volume of air into which the buildup of any undesired byproduct species may "vent" by diffusion of the species. The opening may include an open or vented top of a needle corona source or a wire corona source.

The flow of gases via the outlet may be controlled by a mass flow controller or some other flow or pressure control device coupled to the outlet. Gas exiting the outlet may be replaced via the control devices described herein or via the introduction of ambient gas through the corona deposition opening. The flow of gas exiting the outlet may also be modified by a control device coupled to an inlet of the corona source. Furthermore, as in gas introduction to the corona source, a flow rate of gases removed from a corona source as described herein may be reduced, or even shut on and off, for relatively brief periods of time via either a flow controller, a controllable valve, or another suitable control device.

Figure 8:
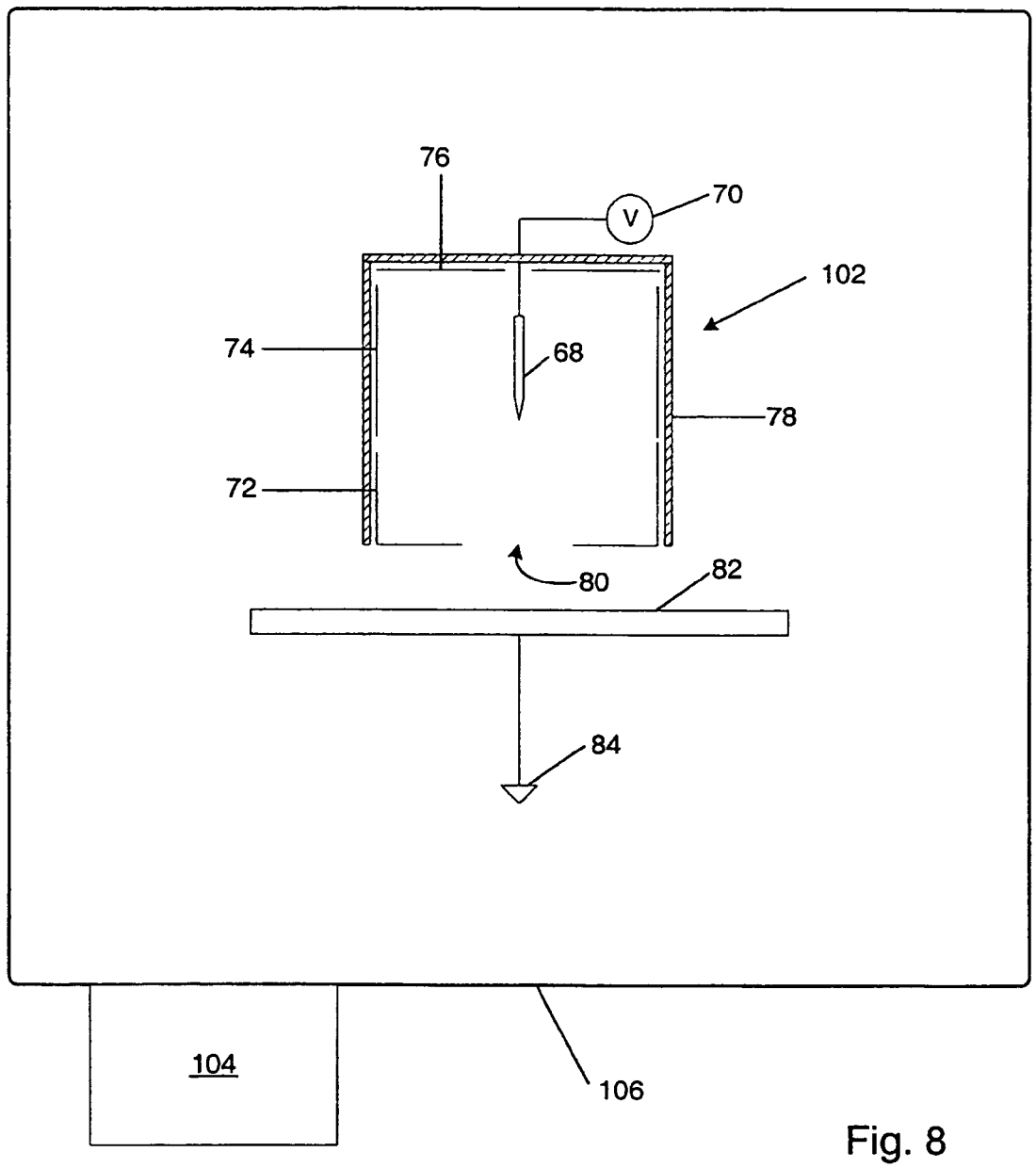
FIG. 8 depicts a cross-sectional view of an embodiment of a system that include a corona source and an environmental control unit.

FIG. 8 illustrates a cross-sectional view of an embodiment of a system that includes corona source 102 and environmental control unit 104. Corona source 102 may be configured as shown in FIG. 6, and elements of the corona source, which are shown in both FIGS. 6 and 8, have been indicated using the same reference numerals. Corona source 102 may be disposed within measurement chamber 106, and environmental control unit 104 may be disposed external to measurement chamber 106. Environmental control unit 104 may be configured to alter a property of the environment within corona source 102. The property may include temperature, pressure, and/or humidity in the region of corona production. For example, environmental control unit 104 may include various sensors configured to measure a temperature, pressure, and/or humidity within corona source 102. The sensors may be disposed within measurement chamber 106 proximate to or within corona source 102. In addition, environmental control unit 104 may include one or more controllers configured to alter the temperature, pressure, and/or humidity in response to the measurements. For example, environmental control unit may include a heating element, a cooling element, a pressure control valve, or another suitable pressure control device, and/or a gas flow control device. Such environmental control units are commercially available.

In addition, output signals from the environmental control unit, which may be responsive to a property of the environment within a corona source, may be used to alter a parameter of the corona source. For example, the environmental control unit may be coupled to a controller coupled to the corona source. The environmental control unit may be configured to send output signals to the controller. The controller may include a processor configured to determine a parameter of the corona source from the output signals. The controller may also be configured to alter a parameter of the corona source such that the parameter is approximately the parameter determined from the output signals. In this manner, performance of the corona source may be modified in response to one or more parameters of the environment of the corona source such that the performance is substantially constant or to improve the performance of the corona source. For example, the parameters of the environment within the corona source may be used to modify the corona deposition parameters to produce more controlled corona.

Theoretical models for corona generation indicate a sensitivity of various parameters to properties of the environment within a corona source described herein. As an example, the initiation voltage for a point-to-plane spark discharge is known to obey a relationship known as Peek's law, which may be described by the equation:

$$V = 30 fd \left(\frac{P}{P_0}\right)\left(\frac{T_0}{T}\right)\left\{1 + 0.3\sqrt{\frac{1}{a}\left(\frac{P}{P_0}\right)\left(\frac{T_0}{T}\right)}\right\}, \quad (1)$$

where V is the initiation voltage (kV), P is the pressure (torr), T is the temperature (K), $T_0$ is a reference temperature of 273 K, $P_0$ is a reference pressure of 760 Torr, d is the gap (cm), f is a constant equal to approximately 1, and a is the radius of curvature of the discharge electrode (cm). This relationship demonstrates the sensitivity of the corona initiation process to pressure and temperature. Other known dependencies of the corona process to humidity are known as well.

A property of the environment, which may also be altered by an environmental control unit, may include a partial pressure of one or more gases in the corona source. For example, the one or more gases may include constituent gases in the corona source. Control of the partial pressures of the constituent gases may lead to better control of corona generation. In uncontrolled ambient conditions, typical corona species which may be formed may include, but are not limited to, $H+(H_2O)_n$ and $CO^{3-}$ via a sequence of reactions in the uncontrolled ambient environment. In other gaseous environments, other ions may be the dominant species. Environmental control unit may include gas flow control devices, which may be configured to alter an amount of one or more gases within the corona source by controllably removing or adding the one or more gases to the environment of the corona source. The environmental control unit may include a control device as described herein.

Figure 9:
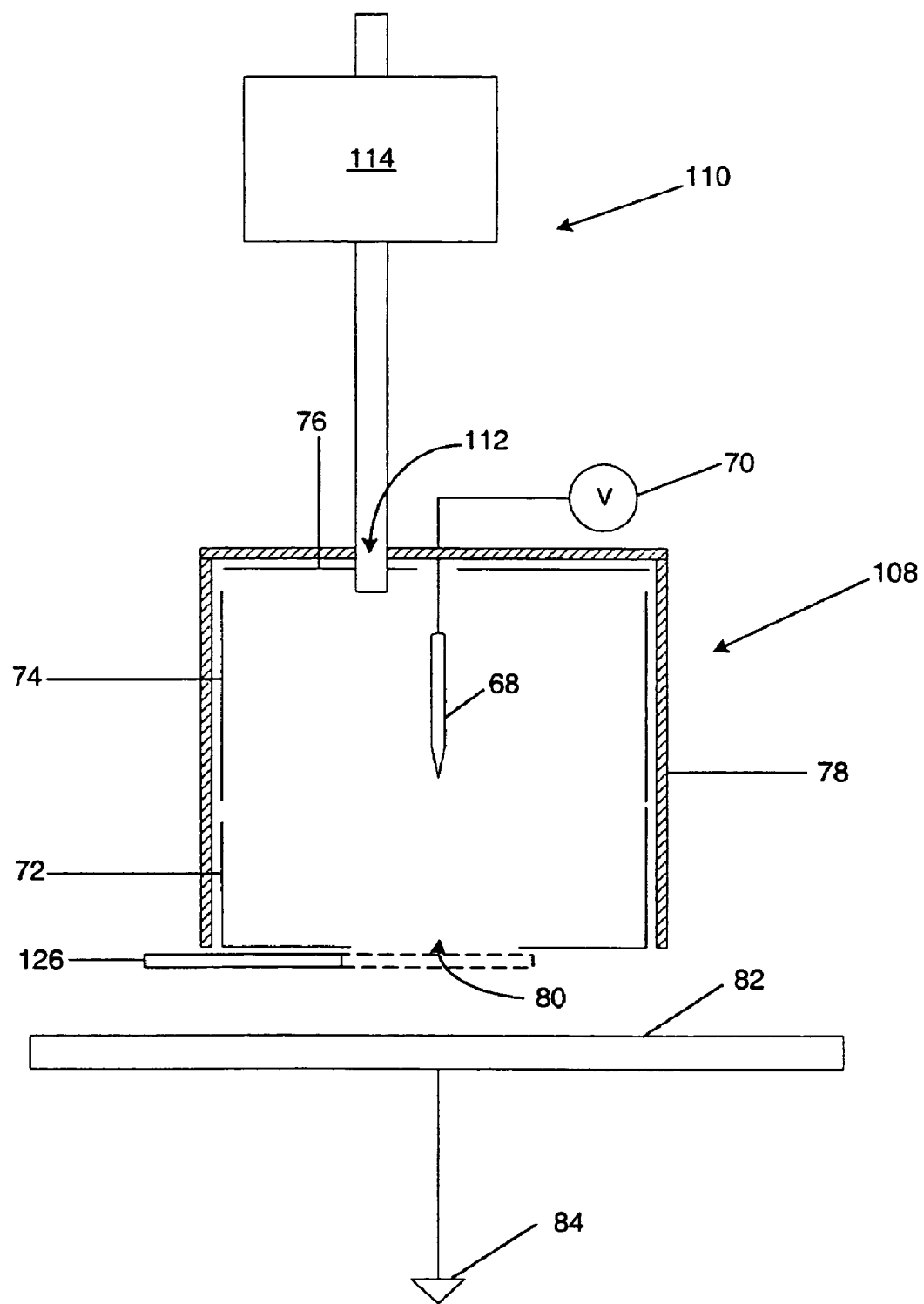
FIG. 9 depicts a cross-sectional view of an embodiment of a system that include a corona source and a control device.

FIG. 9 illustrates a cross-sectional view of a system that include corona source 108 and control device 110. Corona source 108 may be configured as shown in FIG. 6, and elements of the corona source, which are shown in both FIGS. 6 and 9, have been indicated using the same reference numerals. Corona source 108 may also be disposed within a measurement chamber as described herein. Control device 110 may be configured to alter an amount of one or more gases within the corona source. For example, control device 110 may be configured to control the gaseous environment within the corona source via tube 112 coupled to an opening in the corona source, which may be configured to feed gases having a predetermined composition into the corona source. The gases may include, for example, substantially pure nitrogen ($N_2$). Controller 114 may be coupled to tube 112. Controller 114 may be configured to alter a composition and/or flow rate of gases flowing through the tube to control gas flow into the corona source. Controller 114 may include a gas flow controller such as a mass flow controller, a pressure control valve, a controllable valve or any other gas flow controller known in the art. In addition, one or more such control devices may be included in such a system.

Figure 10:
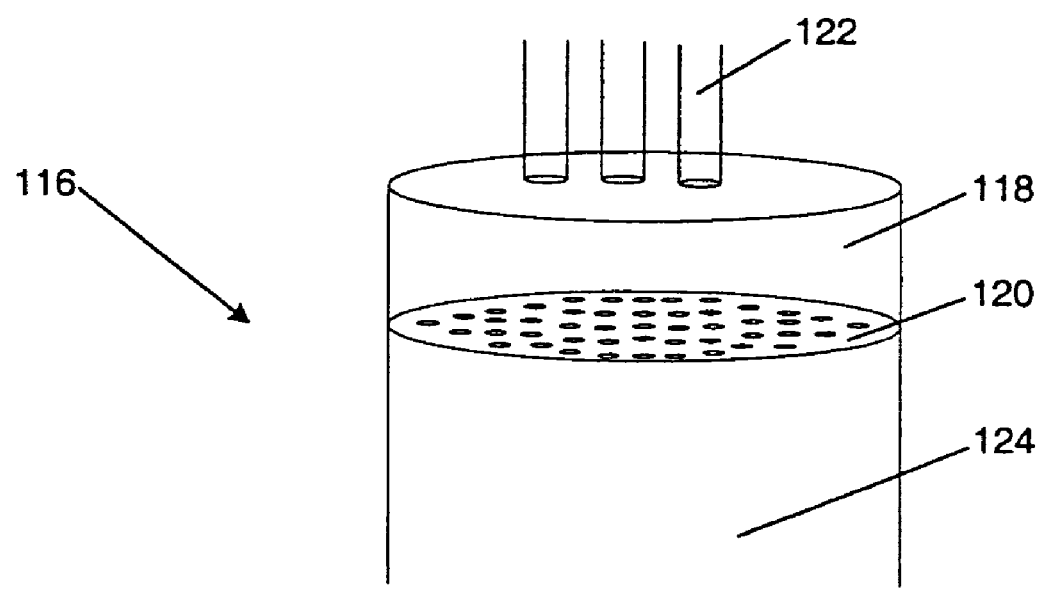
FIG. 10 depicts a schematic perspective view of an embodiment of a control device.

FIG. 10 illustrates a schematic side perspective view of an alternate embodiment of a control device. Control device 116 may include mixing chamber 118 coupled to showerhead distributor 120. One or more gases may be fed into mixing chamber 118 via one or more tubes 122. The one or more gases may mix in mixing chamber 118 due to the variations between a diameter of the mixing chamber and a diameter of the tubes. The mixed gases may flow from mixing chamber 118 through showerhead distributor to a corona source coupled to an end of tube 124 downstream of the showerhead distributor.

The flow of one or more gases in the corona source may be at a different level during generation of corona as compared to the level of the flow rates of the gases during other periods. For example, introduction of gases at a high enough rate may cause turbulence within the corona source, which may affect corona distribution inside the corona source. Flow rates that may cause turbulence may be determined using known fluid flow equations. In this manner, flow of gases into the corona source may be temporarily reduced, or even shut off, during periods of corona deposition. For example, the flow rates for one or more gases into and/or out of a corona source may be at an initial level. At a relatively small time interval, prior to production of corona, the flow rates of the one or more gases may be changed to a new level. The new level may be lower than the initial level. After another relatively small time interval, subsequent to the production of corona, the flow rates of the gases may be changed back to the initial level. The flow rates of each of the one or more gases into and/or out of the corona source may be controlled substantially independently. A control device as described herein may be configured to temporarily reduce, or even shut off, flow rates of gases being introduced into a corona source. A system may also include additional gas flow valves that may be configured to temporarily reduce, or even shut off, flow rates of gases being introduced into a corona source. In a further alternative, the flow of gases into the corona source may be maintained at sufficiently low flow rates to avoid causing turbulence within the corona source. Sufficiently low flow rates may also be determined from fluid flow equations. Therefore, the flow rates may be sufficiently low to avoid disturbance of corona generation process as characterized by I-V characteristics of the corona source.

Alternatively, or additionally, calibration of the workfunction of the sensors may correct for drift in the corona source due to deposition of corona generation byproducts on the corona source. Such calibration may be performed using an absolute reference material having a workfunction that does not drift or that drifts negligibly relative to potential measurements of interest. Such a reference surface may be disposed used within a controlled environment as well. Such an environment may be provided with a vacuum system.

One or more gases being removed from the corona source as described herein may include some charged species. The one or more gases may be removed through a tube coupled to an opening, or an outlet as described above, in a corona source. Charged species may be collected onto conductive surface of the tube thereby separating the charged species from the one or more gases. In addition, the tube may be grounded such that the charged species may be separated from the one or more gases being removed from the corona source. For example, the tube may include grounded external surfaces.

One or more gases being removed from the corona source may also include corona generation byproducts such as ozone. Therefore, one or more gases may be removed from the corona source as described herein. A tube of the control device through which the one or more gases may flow from the corona source may include a gettering material such as magnesium. Any other commercially available gettering material may also be used. In this manner, the byproducts may be separated from the one or more gases being removed from the corona source.

Furthermore, a gettering material may also be disposed upon internal surfaces of the corona source or upon internal surfaces of a measurement chamber of the system. The gettering material may be selected to remove one or more species, such as byproducts produced by a corona generation process, from the environment within the corona source. The one or more species may include, for example, ozone. The gettering material may include any material known to getter ozone such as magnesium. The gettering material, however, may also include any other gettering material known in the art.

One or more properties of the environment within a measurement chamber in which the corona source is disposed may also be altered. For example, a temperature, pressure, humidity, and/or partial pressure of gases within the measurement chamber may be altered with an environmental control unit, a control device, a gettering material disposed within the measurement chamber or any other control device or material known in the art. In a further example, a flow of one or more gases may be introduced outside of the corona source proximate a specimen, or in the area of deposition. The flow of the one or more gases may be controlled by a gas flow device configured to alter a flow of the one or more gases external to the corona source and proximate to the specimen. In this manner, the volume of gas in the deposition area may be substantially continually refreshed. Furthermore, the flow of the one or more gases may be controlled such that the flow includes horizontal laminar flow of gases proximate the specimen. For example, parameters of a gas flow device may be set at values that may be determined from known fluid flow equations. A measurement chamber or measurement system environment may also be controlled to reduce, or even substantially remove, any undesired effects to a specimen.

A significant amount of undesired species may be deposited upon a specimen through a deposition aperture in a corona source when the corona source is not in use. Such corona deposition may take place at least partially due to space charge generated within the gun, which continues to decay after the voltage source is turned off. Deposition of such undesired species may be reduced, or even eliminated, by closing the deposition aperture when the corona source is not in use. For example, as shown in FIG. 9, shutter 126 may be coupled to corona source 108 external to a housing of the corona source. Shutter 126 may be configured to be moved over, or in front of, the aperture during periods of time when charge in not being deposited upon a specimen, as shown in phantom in FIG. 9. The shutter may be moved by any mechanical device known in the art. In addition, the mechanical device may be coupled to a controller device that may be configured to automatically move the shutter upon detection of a period of non-corona deposition by the corona source. In addition, shutter may remain over, or in front of, the aperture at all times except when corona deposition is desired. Furthermore, a shutter as described herein may reduce interactions between residual gases within a corona source when the corona source is not being used to deposit a charge onto a specimen. Such a shutter may be coupled to any of the corona sources as described herein.

A corona source may also be differentially pumped to avoid leakage of unwanted species into the space proximate to a specimen while allowing desired species into the gun to generate corona. In addition, to reduce, and even avoid, deposition of this excess unwanted charge onto a specimen, the source may be reverse biased to electrically pull the previously generated corona into a mask or body of the source. In addition, an air/vacuum source may be used to evacuate and/or recycle gases within the source and to replace the gases with neutral species. In practice, appropriate biasing potential may be used to pull the species onto internal surfaces of the corona source.

An uncontrolled spacing between a corona source and a specimen may cause variations in the amount of corona deposited on a surface of the specimen. As described above, to the first order, the lowest aperture of a corona source may determine a lateral dimension of a focused spot onto which corona may be deposited by the source. By measuring the distance between this surface and a surface of the specimen, corona source voltages may be monitored to compensate for variations in the gap or to provide a positioning feedback loop to alter the source-specimen separation. Such positions may be recorded and modeled out of measured data subsequent to measurement of the parameters. In addition, source-specimen separation may be measured by capacitance coupling of the source mask with the specimen or other measurements such as, but not limited to, optical measurement and air damping.

As described above, a sensor of a system as described herein may be a Kelvin probe or a Monroe probe. Variations in the performance of a Kelvin and Monroe probes may be caused by variation in an environment surrounding the probes. For example, variations in an environment surrounding the probes may be affect probe workfunction and the separation between the probe and the sample. Examples of factors that may affect probe workfunction include, but are not limited to, exposure time, recovery time, pressure, humidity, temperature, gas type, probe surface finish, outgassing of the specimen introduced into the environment, corona generation, intensity of illumination at or through the probe, and temperature of the probe. Absorption of uncontrolled species on surfaces of a probe may affect the workfunction of the probe. A shift in workfunction may directly affect tool matching and tool stability. Any unwanted or uncontrolled gaps between a specimen and a probe may create noise in a measurement.

Several methods may be used to reduce variation in the workfunction of a probe. For example, one or more gases may be flowed proximate the surface of the sensor using any of control units or devices described herein such as a gas flow device or a mass flow controller. A gas flow device may be configured to remove one or more gases proximate the sensor to reduce deposition of corona byproducts on the sensor. In addition, a controlled flow of "purge" gases may be introduced over the surface of the sensor. The one or more gases may include, but are not limited to, relatively clean, dry air and nitrogen ($N_2$). In this manner, the sensor may be protected from corona byproducts.

The measurement may be performed in a vacuum environment. Such measurements may require a biasing method to be compatible with the vacuum measurement environment. For example, a corona-based biasing device in a vacuum system having a vacuum level lower than a vacuum that may be generated in an ultra-high vacuum system. In such a system, the biasing may be performed with a differentially pumped system.

A system may also be operated in substantially the same sequence of events such that a probe may be exposed to the same type of variations. In this case, applying a usage model in which specimens are measured in the same sequence, one may match the systems and may assume similar workfunction drift amongst the systems involved. To that extent, a sequence of measurements may be arranged to proceed after preconditioning of the system. The preconditioning may force the system environment, and hence the probe workfunction, to a desired state. The system may also be exercised to maintain the system in a substantially steady state form.

A probe may be designed to have a substantially stable workfunction by designing the probe to be formed of a substantially inert material. For example, gold may be used as an inert material for a probe. More preferably, other substantially inert materials that may be used in a probe may include, but are not limited to, stainless steel, indium tantalum oxide (ITO), and tantalum oxide. The workfunction of a probe may also be referenced to a reference sample provided the reference sample has a steady workfunction. For example, gold is a stable material for which the workfunction is relatively stable. A reference sample surface may be treated prior to calibration to provide a sample sufficiently stable for calibration. The treatment may include, for example, heating the surface of the reference sample to desorb absorbents.

Heating may also be used to clean measurement probes. For example, an intense light source may be used to remove airborne molecular contamination from the probes to stabilize their workfunction. A built in heater may provide elevated temperatures to prevent these contaminates from adsorbing onto the probes.

Measurements may be designed to take into consideration changes in workfunction. For example, to the first order $C_{ox}$ is a differential measurement described by the equation:

$$C_{ox} = \frac{Q_1 - Q_2}{V_1 - V_2}, \quad (2)$$

wherein $V_1$ is the induced potential due to charge $Q_1$ plus the workfunction of the probe, and $V_2$ is the induced potential due to charge $Q_2$ plus the workfunction of the probe. As long as the time difference between $Q_1$ and $Q_2$ is not large enough to induce a relatively large shift in the probe workfunction, or the amounts of $Q_1$ and $Q_2$ are not substantially different to cause the probe to measure different amounts of species thereby causing its workfunction to shift, this simple differential technique may account for shifts in the workfunction. In reality, $C_{ox}$ may have a more complex form especially for thin films, and it may require more care to have a differential measurement. Such complex forms for thin films are known in the art.

Capacitance is a function of separation between the probe and a specimen. Any vibration or errors in the separation may directly translate into an error in the measurements. Vibration damping may also be provided such that outside the frequencies of operation of the sensors the outside mechanical and acoustic vibrations may not affect the measurements adversely. A feedback loop may also be provided to control the spacing between the probe and a specimen thereby keeping the spacing substantially constant throughout the measurements. In addition, the separation of the two bodies may be measured and a fine motion control actuator may be used to null the position errors. Furthermore, the gap may be set once at the beginning of a measurement and may be corrected later for variations of the separation subsequent to measuring the parameter.

Each of the systems described herein may include a processor. The processor may be configured to receive output from a sensor as described herein. The output from the sensor may be responsive to a parameter such as a potential or a photovoltage of the specimen as measured by the sensor. The processor may also be configured to determine a property of the specimen from the output. The processor may be further configured to monitor the determined properties of multiple specimens to monitor processes used to form the specimen. In addition, the processor may be configured to determine if the process is reproducible and/or within acceptable limits from the determined property of the specimen and/or multiple specimen. Therefore, such a system may be used to monitor and/or evaluate a process tool during process tool qualification, process development, and manufacturing.

Data gathered from the electrical measurement sensors may be used to provide feedback regarding a process performed on the wafers in a process tool. The feedback may include automatically altering a parameter of a process tool to alter, and even optimize, a process step. Alternatively, the feedback may include providing an output signal if a property of the specimen is outside of a predetermined range for the property. The output signal may be a visual signal such as a flag, which may be viewed by an operator of the process tool, or an audible signal.

In an embodiment, the processor may also be configured to alter a parameter of a process tool in response to the property using a feedback control technique, a feedforward control technique, and/or an in situ control technique. For example, the processor may be coupled to a process tool such that the processor may send control signals to various instruments of the process tool. The control signals may be responsive to the property of the specimen determined by a system as described herein. As such, the system may be configured to automatically alter a parameter of a process tool in response to a determined property of a specimen. In addition, the processor may be configured to generate an output signal if the property is outside of a predetermined range for the property. The output signal may be a visual signal such as a flag or an audible signal. The output signal may also include any other output signal that may be detected by an operator.

A measured optical film thickness and a measured electrical film capacitance determined by a product wafer Quantox system as described herein may be used to determine a dielectric constant of the film at various frequencies. In an embodiment, the processor may be configured to determine a dielectric constant from the optical film thickness and the electrical film capacitance. The optical film thickness may be determined by an additional system such as, but not limited to, a reflectometer, a spectroscopic reflectometer, an ellipsometer, and a spectroscopic ellipsometer.

A processor, as described herein, may be a computer system configured to operate software to perform according to the above embodiments. The computer system may include a memory medium on which computer programs may be stored for controlling the system and processing the detected energy. The term "memory medium" is intended to include an installation medium, e.g., a CD-ROM, or floppy disks, a computer system memory such as DRAM, SRAM, EDO RAM, Rambus RAM, etc., or a non-volatile memory such as a magnetic media, e.g., a hard drive, or optical storage. The memory medium may include other types of memory as well, or combinations thereof. In addition, the memory medium may be located in a first computer in which the programs are executed, or may be located in a second different computer that connects to the first computer over a network. In the latter instance, the second computer provides the program instructions to the first computer for execution. Also, the computer system may take various forms, including a personal computer system, mainframe computer system, workstation, network appliance, Internet appliance, personal digital assistant ("PDA"), television system or other device. In general, the term "computer system" may be broadly defined to encompass any device having a processor, which executes instructions from a memory medium.

The memory medium may be configured to store a software program for the operation of the system to determine at least two properties of a specimen. The software program may be implemented in any of various ways, including procedure-based techniques, component-based techniques, and/or object-oriented techniques, among others. For example, the software program may be implemented using ActiveX controls, C++ objects, JavaBeans, Microsoft Foundation Classes ("MFC"), or other technologies or methodologies, as desired. A CPU, such as the host CPU, executing code and data from the memory medium may include a means for creating and executing the software program according to the methods described above.

Various embodiments further include receiving or storing instructions and/or data implemented in accordance with the foregoing description upon a carrier medium. Suitable carrier media include memory media or storage media such as magnetic or optical media, e.g., disk or CD-ROM, as well as signals such as electrical, electromagnetic, or digital signals, conveyed via a communication medium such as networks and/or a wireless link.

A product wafer Quantox system as described herein and its various subsystems may be coupled to a process tool. For example, one or more of the subsystems of a product wafer Quantox system may be integrated into a processing chamber of a process tool for in situ measurements. In this manner, the product wafer Quantox system may be used to perform in situ measurements. The measurements may be performed on wafers before, after, or during each or any combination of process steps.

Figure 11A:
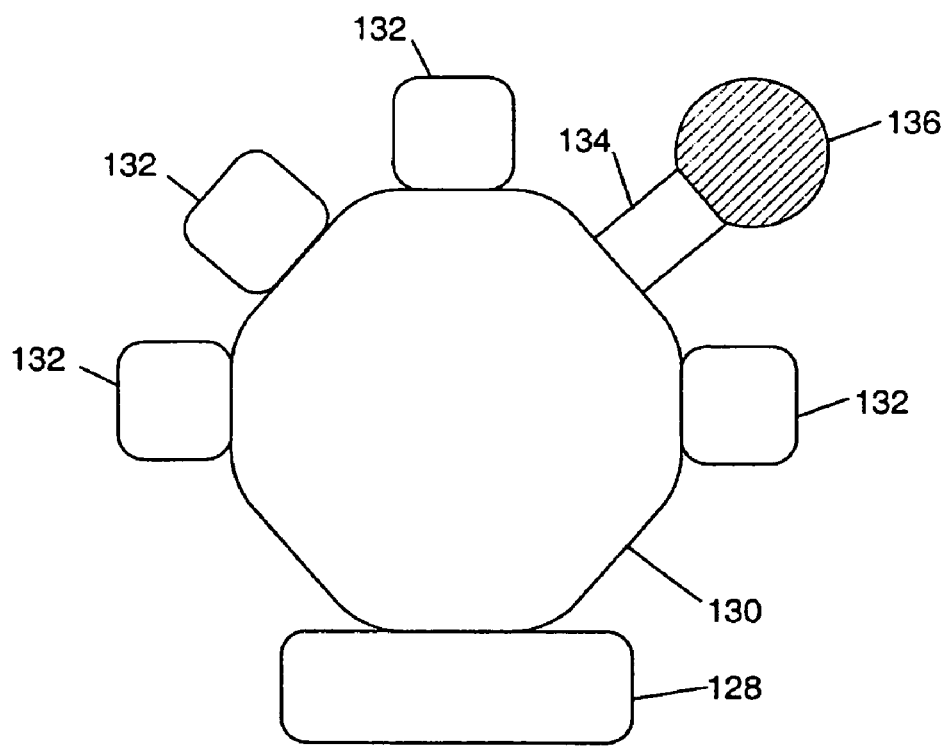
FIGS. 11a–11g depict schematic plan views of various embodiments of a system configured to determine a property of a specimen coupled to a process tool.

FIG. 11a illustrates a schematic plan view of an embodiment of a product wafer Quantox system coupled to a process tool. A process tool as described herein may include, but is not limited to, a deposition tool such as a chemical vapor deposition tool, a physical vapor deposition tool, and an atomic layer deposition tool, an etch tool such as a plasma etch tool, a chemical-mechanical polishing tool, a thermal tool such as a rapid thermal anneal tool and a diffusion furnace, and an ion implantation tool.

As shown in FIG. 11a, a process tool may include handler port 128. Handler port 128 may be configured to receive one or more cassettes or pods containing a plurality of product wafers. The process tool may also include main distribution chamber 130. Main distribution chamber 130 may be coupled to handler port 128 and a number of process chambers 132. In this manner, wafers may be moved from the handler port to one or more of the process chambers in a sequence by a robotic wafer handler (not shown) disposed within the main distribution chamber. In addition, main distribution chamber 130 may be coupled to a transfer port 134. Transfer port 134 may also be coupled to product wafer Quantox system 136. The robotic wafer handler of the main distribution chamber may be configured to place wafers into the transfer port. The transfer port may include a wafer transfer device such as a bi-directional robotic arm that may be configured to move the wafers received from the main distribution chamber into product wafer Quantox system 136. In an alternative embodiment, the transfer port may be eliminated from the system, and the robotic wafer handler may be configured to transfer wafers directly to system 136 from chamber 130. Such an embodiment of a product wafer Quantox system may be configured to determine a property of a product wafer after the product wafer has been received in the main distribution chamber but before any process steps, between process steps, and/or after all process steps have been completed but before the wafer is placed back into the handler port. Although four process chambers and one product wafer Quantox system are shown in FIG. 11a, any number of process chambers or product wafer Quantox systems may be coupled to a process tool. In addition, the number and locations of process chambers and product wafer Quantox systems shown in FIGS. 11b–11g may also be changed.

Figure 11B:
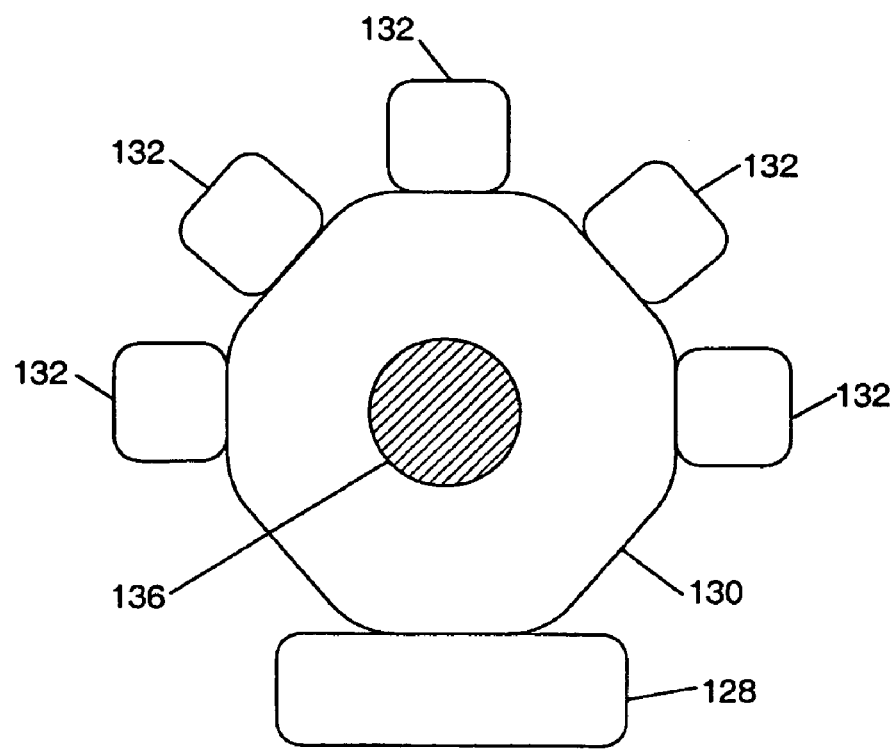

FIG. 11b illustrates a schematic plan view of another embodiment of a product wafer Quantox system coupled to a process tool. The process tool may include handler port 128, main distribution chamber 130, and process chambers 132 as described herein. In this embodiment, however, product wafer Quantox system 136 may be disposed within main distribution chamber 130. In this manner, the product wafer Quantox system may be configured to determine a property of a product wafer after the product wafer has been received in the main distribution chamber but before any process steps, between process steps, and/or after all process steps have been completed but before the wafer is placed back into the handler port.

Figure 11C:
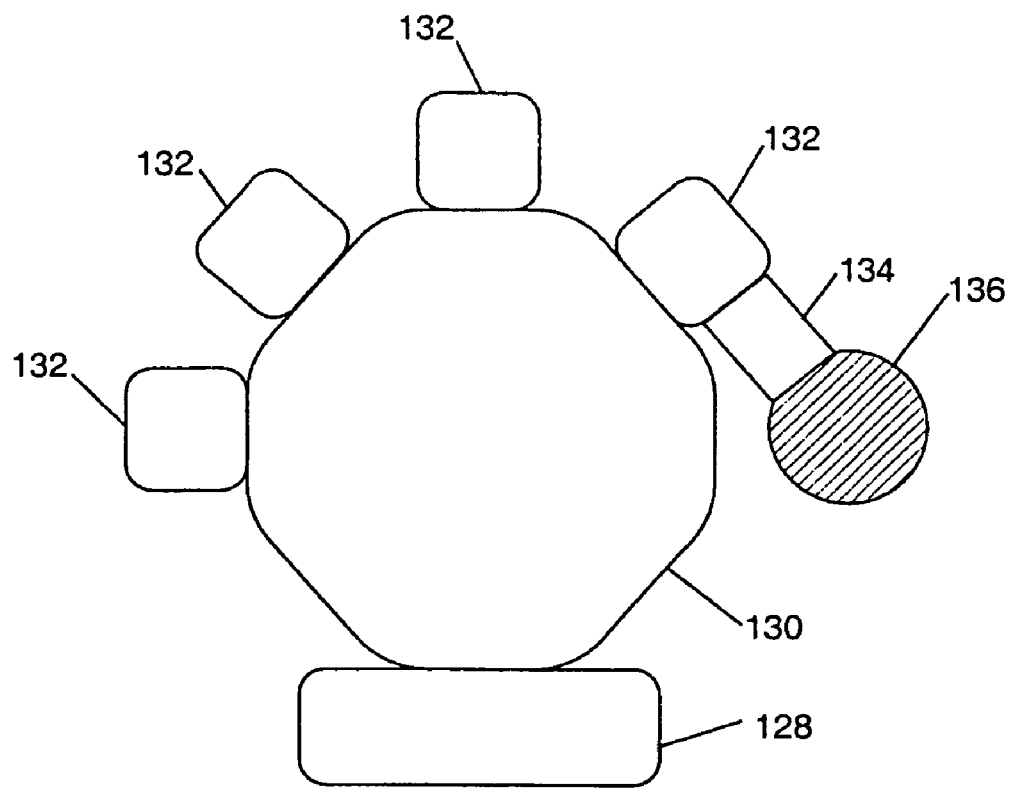

FIG. 11c illustrates a schematic plan view of an additional embodiment of a product wafer Quantox system coupled to a process tool. The process tool may include handler port 128, main distribution chamber 130, and process chambers 132 as described herein. In this embodiment, transfer port 134 may be coupled to one of the process chambers. Transfer port 134 may also be coupled to product wafer Quantox system 136. Transfer port 134 may be configured to transfer wafers between the process chamber and system 136. Transfer port 134 may be further configured as described herein. In an alternative embodiment, the transfer port may be eliminated from the system, and a handler, a stage, or another mechanical device of the process chamber or system 136 may be configured to directly transfer wafers between system 136 and chamber 132. In this manner, the product wafer Quantox system may be configured to determine a property of a product wafer before and/or after a process step performed in the process chamber.

Figure 11D:
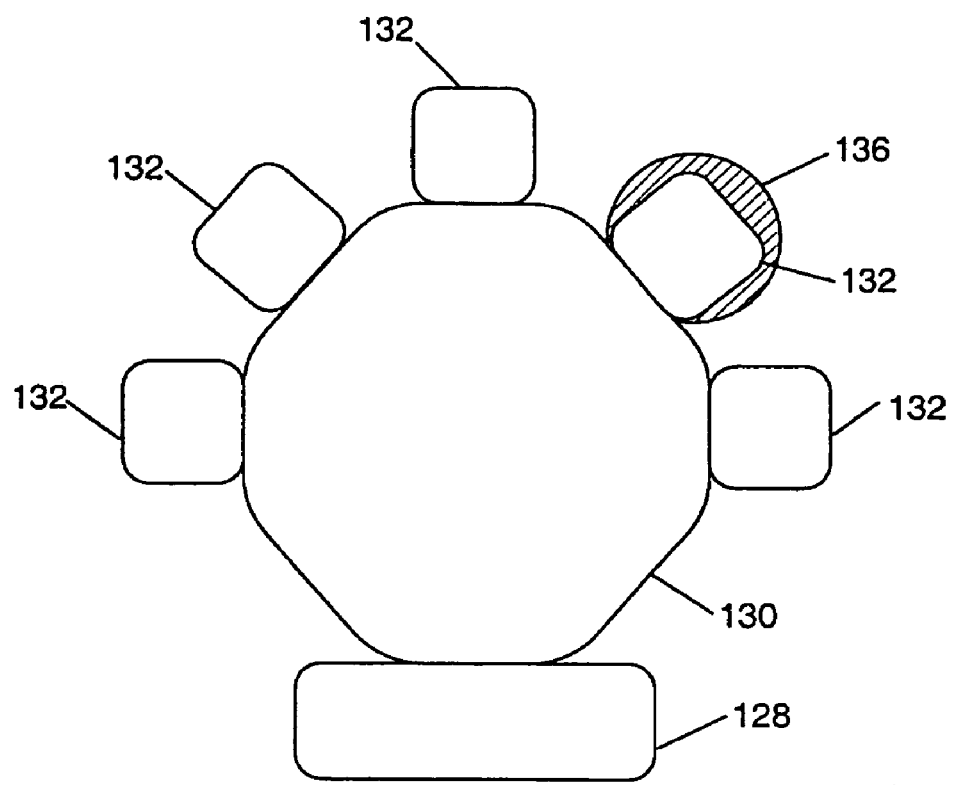

FIG. 11d illustrates a schematic plan view of a further embodiment of a product wafer Quantox system coupled to a process tool. The process tool may include handler port 128, main distribution chamber 130, and process chambers 132 as described herein. In this embodiment, product wafer Quantox system 136 may be disposed above or below process chamber 132. In this manner, there may be a z-axis offset between the process chamber and the product wafer Quantox system. As such, the processing chamber and the product wafer Quantox system may share substantially the same robotic wafer handler load and unload location. Such an embodiment of a product wafer Quantox system may be configured to determine a property of a product wafer after the product wafer has been received in the main distribution chamber but before any process steps, between process steps, and/or after all process steps have been completed but before the wafer is placed back into the handler port.

Figure 11E:
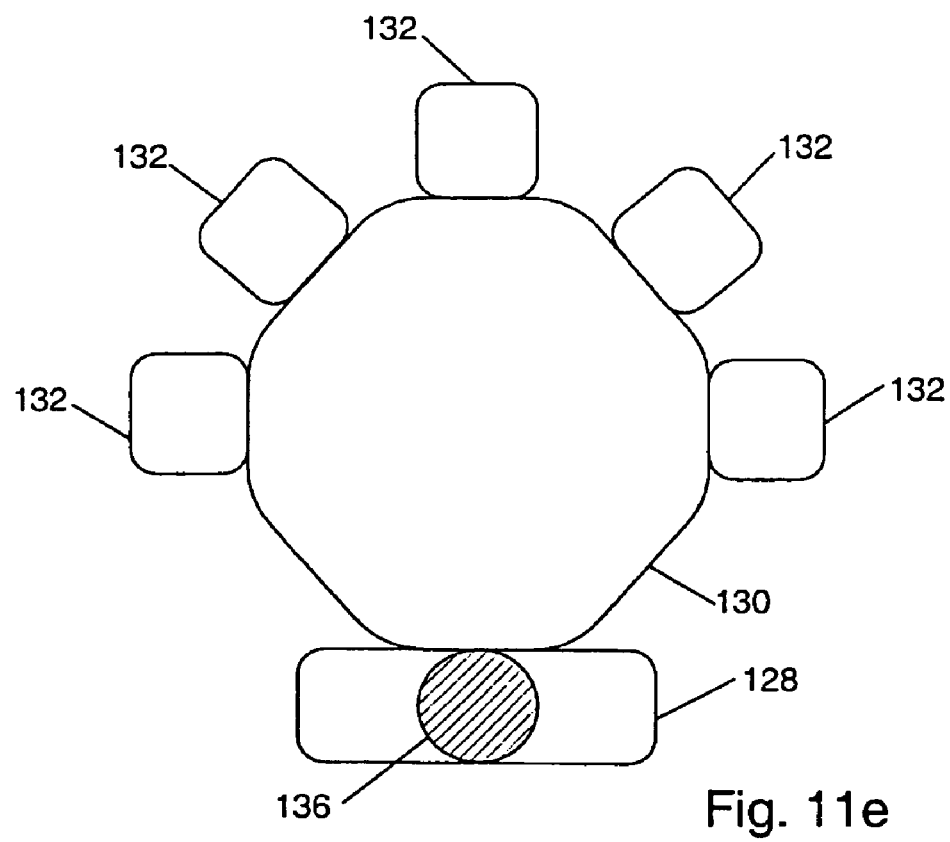

FIG. 11e illustrates a schematic plan view of another embodiment of a product wafer Quantox system coupled to a process tool. The process tool may include handler port 128, main distribution chamber 130, and process chambers 132 as described herein. In this embodiment, product wafer Quantox system may be disposed within handler port 128. In this manner, product wafers may be directly loaded into the product wafer Quantox system, for example, by an operator. As such, a product wafer Quantox system may be configured to determine a property of a product wafer before any process steps, between process steps, and/or after all process steps have been completed.

Figure 11F:
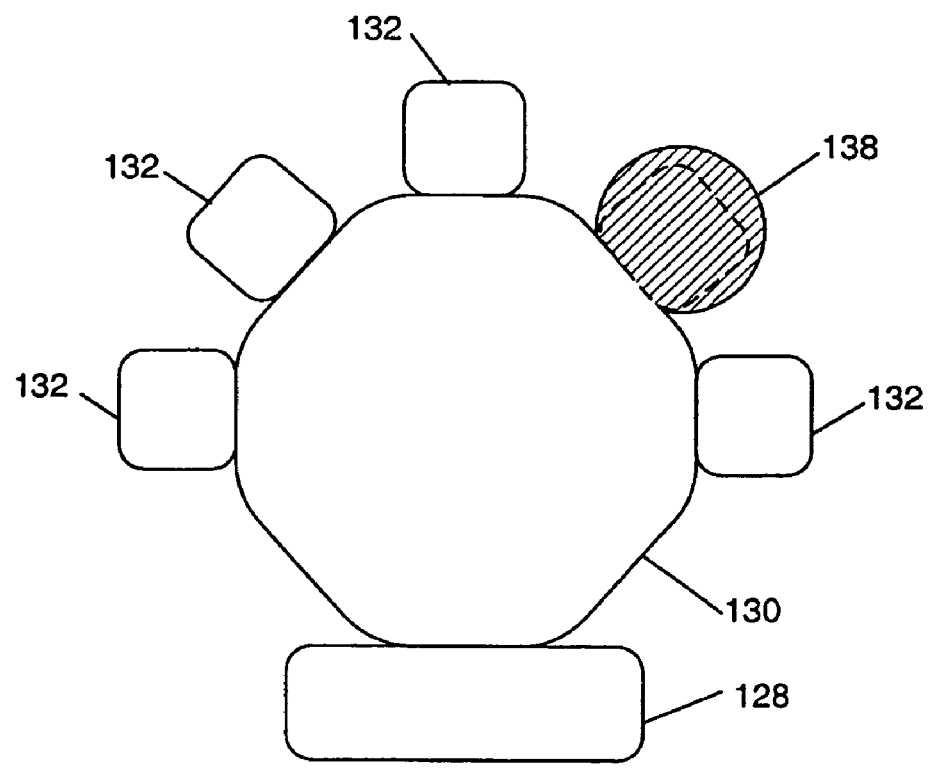

FIG. 11f illustrates a schematic plan view of an additional embodiment of a product wafer Quantox system coupled to a process tool. The process tool may include handler port 128, main distribution chamber 130, and process chambers 132 as described herein. In this embodiment, a product wafer Quantox system and a process chamber may be coupled in chamber 138. In this manner, a product wafer Quantox system may be configured to determine a property of a product wafer before, after, and/or during a process step performed in the chamber.

Figure 11G:
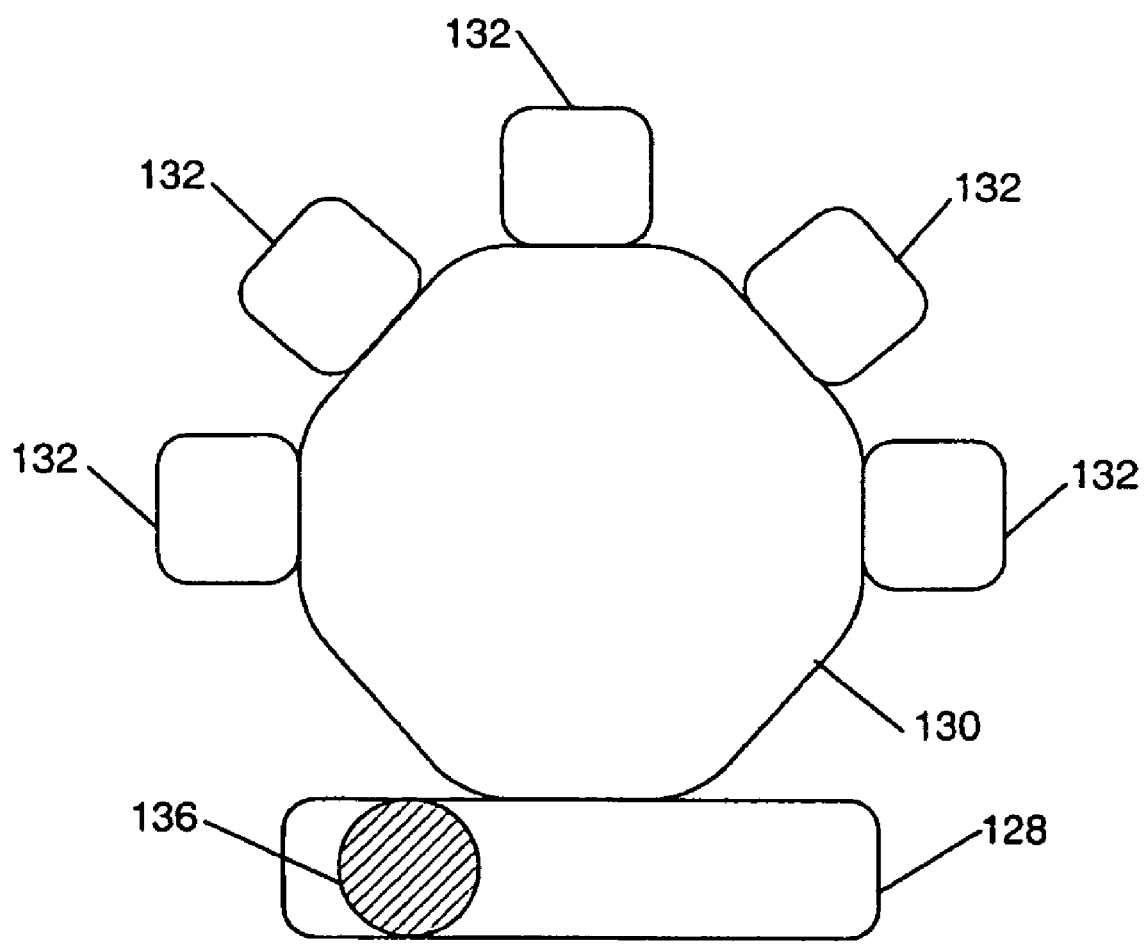

FIG. 11g illustrates a schematic plan view of yet another embodiment of a product wafer Quantox system coupled to a process tool. The process tool may include handler port 128, main distribution chamber 130, and process chambers 132 as described herein. In this embodiment, product wafer Quantox system 136 may be disposed within handler port 128 such that the system replaces a load port of the handler port. As such, a product wafer Quantox system may be configured to determine a property of a product wafer before any process steps, between process steps, and/or after all process steps have been completed.

In alternative embodiments, one or more subsystems of a product wafer Quantox system may be coupled to a process tool instead of an entire system. For example, each of the embodiments illustrated in FIGS. 11a–11g may include only a measurement head of a product wafer Quantox system instead of the entire product wafer Quantox system. Each of the one or more subsystems may be disposed within a measurement chamber. The one or more measurement chambers may be coupled to a process tool. In this manner, the one or more subsystems may be coupled to the process tool individually. The one or more subsystems may be coupled to the process tool in different locations and manners. For example, a subsystem configured to bias a focused spot on a specimen may be coupled to the tool in a first manner, and a subsystem configured to measure a parameter of a measurement spot on the specimen may be coupled to the tool in a second manner. In addition, one or more product wafer Quantox systems or product wafer Quantox measurement heads may be coupled to a process tool. Each of the systems may be coupled to the process tool differently or similarly according to any of the embodiments described above.

Furthermore, in each of the embodiments described herein, additional measurement systems may also be coupled to the process tool such as an optical measurement system. Examples of appropriate optical measurement systems may include, but are not limited to, a reflectometer, a spectroscopic reflectometer, an ellipsometer, and a spectroscopic ellipsometer. An optical measurement system may be coupled to a process tool in a manner similar to the coupling of a product wafer Quantox system and a process tool, as shown in FIGS. 11a–11g. Alternatively, an optical measurement system may be coupled to a product wafer Quantox system in a multi-purpose system. The optical measurement system and the product wafer Quantox system may share one or more devices such as, but not limited to, a power source, a stage, a handler, and a processor. The multi-purpose system may be coupled to a process tool as described herein. The data acquired by the optical measurement system and the product wafer Quantox system may be combined to control the performance of a process tool. For example, the combined data may be used to alter a parameter of the process tool using a feedback control technique, a feedforward control technique, and/or an in situ control technique.

If one or more product wafer Quantox systems or a product wafer Quantox system and an additional measurement system are coupled to a process tool, a first property of the specimen may be determined prior to a process step. In addition, a second property of the specimen may be determined subsequent to the process step. Alternatively, a single product wafer Quantox system may be used to determine a first property of the specimen prior to a process step and subsequent to the process step. A processor as described herein may be configured to determine a relationship between the first property and the second property. The relationship may be representative of variations in the specimen due to the process step.

A sampling scheme may define where in the process measurements are to be made. The sampling scheme may be set up such that the time required for the measurements does not reduce the throughput of the process tool. For example, a processor as described herein may be configured to automatically generate a sampling scheme for wafer processing within a multi-chamber process tool as illustrated in U.S. Pat. No. U.S. Pat. No. 6,201,999 to Jevtic, U.S. Pat. No. 6,224,638 to Jevtic, and PCT Application No. WO 98/57358 to Jevtic, which are incorporated by reference as if fully set forth herein. A sampling scheme may also be developed to determine a property of wafers from a lot, which may then be placed back into the process, without determining a property of the entire wafer lot.

Results from an integrated product wafer Quantox system may be correlated with results from a non-integrated product wafer Quantox system. The non-integrated product wafer Quantox system may be a stand alone reference system. In this manner, the integrated system may be matched to a stand alone reference system. In addition, multiple integrated systems may be matched to a stand alone reference system. The stand alone reference system may be a "full set" metrology system while the integrated systems may include only a subset of its functionality. For example, the integrated systems may be configured as monitor systems, rather than metrology type systems, which may be configured to identify excursions of one or more properties from a predetermined range for the properties. In contrast, the reference system may be configured as a metrology system that may be used to determine additional information related to the excursions or metrology variations. A reference system and an integrated system may be configured to share common devices such as a processor, which may be configured as a computer or a master processor. Multiple stand alone reference systems may be matched with each other. The multiple stand alone reference systems may also be coupled over a computer network such as an intranet or the Internet. The multiple stand alone reference systems may be used in different semiconductor manufacturing facilities.

A processor coupled to a product wafer Quantox system may be configured to generate an output signal such as a flag if the system is not operational or needs maintenance or repair. The output signal may notify a process tool that a measurement step performed by the product wafer Quantox system may be skipped. The measurement system may be coupled to a process tool using a quick disconnect type coupling. In this manner, the measurement system may be isolated and removed from the process tool as a module, and the process tool may be substantially closed off such that processing may continue in the process tool without interruption or down time. As such, if a measurement system needs maintenance or repair, such work will not reduce throughput of a process tool.

Alternatively, one or more measurement heads or systems may be coupled to a process tool. An output signal of a process as described above may then signal the process tool that one or the measurement heads or systems is not operational and that measurements should be performed in one of the other measurement heads or systems. The results of two integrated product wafer Quantox systems may also be correlated. In this manner, one integrated system may be used to determine the property of the specimen thereby monitoring the process and altering the process if necessary while another integrated system may be maintained, repaired, or replaced.

A product wafer Quantox system may also include a wafer transfer mechanism from one type of environment to another. The wafer transfer mechanism may include a load lock chamber that may include a transfer mechanism configured to handle wafers. The system may include vacuum ports configured to isolate a portion of the system with a different pressure than another portion of the system. In addition, the system may include multiple chambers for measurement and other functions. For example, the system may include a pre-aligner configured to move a specimen to a predetermined orientation prior to measurement in a first chamber, and a measurement head in a second chamber. The system may also include subsystems configured in a modular design for quick disconnect from a main subsystem to reduce downtime of the system due to maintenance, repair, or replacement.

In addition, a measurement chamber of either a stand alone or integrated product wafer Quantox system may be configured to reduce the amount of light that enters the measurement chamber. For example, the measurement chamber may reduce, or substantially eliminate, all light from entering into the measurement chamber. Alternatively, the measurement chamber may reduce, or substantially eliminate, predetermined wavelengths of light from entering the measurement chamber. In this manner, photovoltage effects may be controlled during measurements.

Various subsystems of a product wafer Quantox system may also be incorporated into another non-contact system such as a system described in U.S. patent application Ser. No. 09/854,177 entitled "A method of detecting metal contamination on a semiconductor wafer," by Xu et al., which is incorporated by reference as if fully set forth herein. Properties determined by a product wafer Quantox system may also be corrected for leakage through an insulating film as described in U.S. patent application entitled "Methods and systems for determining a property of an insulating film," by Miller et al., which is incorporated by reference as if fully set forth herein.

A system, configured according to any of the embodiments described herein, may be used to perform a non-contact method for determining a property of a specimen. The method may include biasing a focused spot on the specimen. The method may also include measuring a parameter of a measurement spot on the specimen. The measurement spot may overlap the focused spot. In an embodiment, the method may include optically locating a predetermined measurement site on the specimen such that the focused spot and the measurement spot on the specimen may be positioned proximate the predetermined measurement site. In addition, the method may include determining the property of the specimen from the measured parameter.

Biasing the focused spot may include focusing a corona source on the focused spot to deposit a charge on a surface of the specimen within the focused spot. Alternatively, or additionally, biasing the focused spot may include focusing light on the focused spot to generate a photovoltage within the focused spot. The focused spot and the measurement spot may have any of the lateral dimensions as described herein. In an embodiment, measuring the parameter may include measuring the parameter with a probe having a tip. The tip of the probe may have a radius that may be reproducibly controlled.

In an embodiment, biasing the focused spot and measuring the parameter may be performed subsequent to disposing the specimen within a process tool and prior to removing the specimen from the process tool. In this manner, the method may be performed during a process performed in the process tool. The process may include a number of process steps. In an embodiment, biasing the focused spot and measuring the parameter may be performed between process steps performed in the process tool. In an additional embodiment, biasing the focused spot and measuring the parameter may be performed during a process step performed in the process tool. Alternatively, biasing the focused spot and measuring the parameter may be performed prior to disposing the specimen within a process tool or subsequent to removing the specimen from a process tool. In this manner, the method may be performed before or after a process performed in a process tool.

In an embodiment, the method may further include altering a parameter of a process tool in response to the property using a feedback control technique, a feedforward control technique, and/or an in situ control technique. The method may also include generating an output signal if the property is outside of a predetermined range for the property.

In an additional embodiment, the method may be performed in a first system. The method may also include determining an additional property of the specimen with a second system and determining a relationship between the property and the additional property. In a further embodiment, the method may include processing the specimen subsequent to determining the property of the specimen. Such an embodiment may also include determining an additional property of the specimen subsequent to processing of the specimen and determining a relationship between the property and the additional property. The method may further include additional steps as described herein.

A system, configured according to any of the embodiments described herein, may be used to perform a method for varying the performance of a corona source. The method may include altering a property of the environment within the corona source. The property may include, but is not limited to, temperature, pressure, humidity, and/or partial pressure of a gas within the corona source. In an embodiment, altering the property may include introducing one or more gases through a mixing chamber and a showerhead distributor. In an additional embodiment, altering the property may include removing one or more gases from the corona source through an opening within the corona source. In a further embodiment, altering the property may include removing one or more gases from the corona source through a tube coupled to an opening within the corona source. Such an embodiment may also include separating one or more species from the one or more gases within the tube. In an additional embodiment, altering the property may include reducing gas flow rates into and out of the corona source during charge deposition by the corona source. In an embodiment, altering the property may include gettering one or more species from the environment within the corona source.

An additional embodiment of a method for varying the performance of a corona source may include altering a parameter of the environment within a measurement chamber in which the corona source is disposed. In a further embodiment, a method for varying the performance of a corona source may include depositing a charge from the corona source onto a specimen and flowing a gas external to the corona source proximate the specimen. In addition, an embodiment of a method for varying the performance of a corona source may include depositing a charge from the corona source onto a specimen through an aperture in the corona source and, subsequent to depositing the charge, moving a shutter over the aperture to reduce deposition of undesired species onto the specimen. A further embodiment of a method for varying the performance of a corona source may include depositing a charge from the corona source onto a specimen, measuring a parameter of the specimen in response to the charge deposited on the specimen with a sensor, and removing one or more gases proximate the sensor to reduce deposition of corona byproducts onto the sensor.

EXAMPLE

Reduction in Unintended Deposition by a Corona Source

Figure 12:
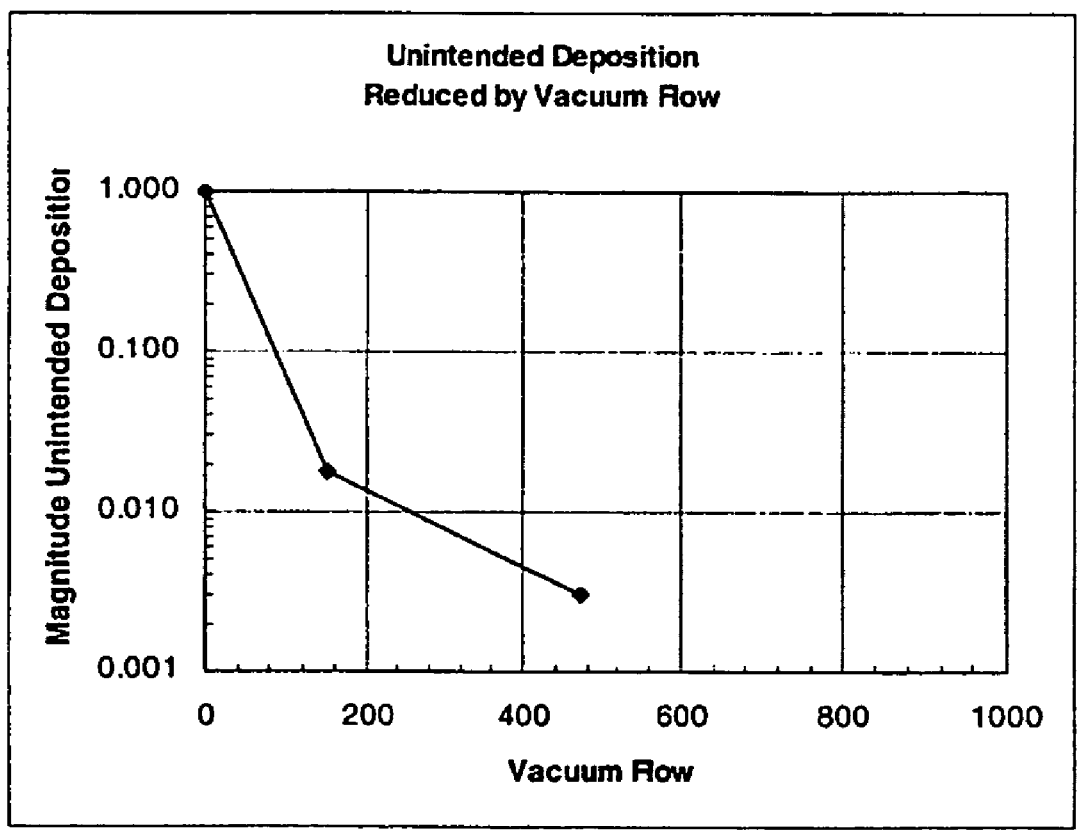
FIG. 12 is a plot of unintended deposition versus vacuum-controlled flow of gases from a corona source.

FIG. 12 is a plot of experimental data illustrating unintended deposition of charge by a corona source versus vacuum-controlled flow of gases from the corona source. Magnitude unintended deposition is plotted on the y-axis, and vacuum flow is plotted on the x-axis. In this case, the undesired species have the effect of causing a subsequent change in voltage on the surface of the wafer when the previously fired corona source is positioned over a portion of the wafer for which no deposition was intended. From the plot, the decrease in magnitude of this undesired effect is clearly evident as the vacuum induced flow is increased.

Further modifications and alternative embodiments of various aspects of the invention may be apparent to those skilled in the art in view of this description. For example, contactless charge measurement of product wafers and control of corona generation and deposition is provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A non-contact method for determining a property of a specimen, comprising:
   optically locating a predetermined measurement site on the specimen using an optics system such that a focused spot and a measurement spot on the specimen can be positioned proximate the predetermined measurement site;
   biasing the focused spot on the specimen, wherein the biasing comprises focusing a corona source on the focused spot to deposit a charge on a surface of the specimen within the focused spot;
   measuring a parameter of the measurement spot on the specimen without contacting the specimen, wherein the measurement spot overlaps the focused spot; and
   determining the property of the specimen from the measured parameter.

2. The method of claim 1, wherein the specimen is a product wafer.

3. The method of claim 1, wherein the biasing further comprises focusing light on the focused spot to generate a photovoltage within the focused spot.

4. The method of claim 1, wherein the focused spot has a lateral dimension approximately equal to a lateral dimension of a gate to be formed on the specimen.

5. The method of claim 1, wherein the focused spot has a lateral dimension selected such that the biasing does not leak into a device area on the specimen.

6. The method of claim 1, wherein the focused spot has a lateral dimension less than a scribe line area spaced from a device area on the specimen.

7. The method of claim 1, wherein the focused spot has a lateral dimension of about 50 μm.

8. The method of claim 1, wherein the focused spot has a lateral dimension greater than a lateral dimension of the measurement spot such that the measurement spot has a substantially uniform bias.

9. The method of claim 1, further comprising performing said biasing and said measuring subsequent to disposing the specimen within a process tool and prior to removing the specimen from the process tool.

10. The method of claim 1, further comprising performing said biasing and said measuring between process steps performed in a process tool.

11. The method of claim 1, further comprising performing said biasing and said measuring during a process step performed in a process tool.

12. The method of claim 1, further comprising performing said biasing and said measuring prior to disposing the specimen within a process tool or subsequent to removing the specimen from the process tool.

13. The method of claim 1, further comprising altering a parameter of a process tool in response to the property using a feedback control technique.

14. The method of claim 1, further comprising altering a parameter of a process tool in response to the property using a feedforward control technique.

15. The method of claim 1, further comprising altering a parameter of a process tool in response to the property using an in situ control technique.

16. The method of claim 1, further comprising generating an output signal if the property is outside of a predetermined range for the property.

17. The method of claim 1, wherein said biasing, said measuring, and said determining is performed with a first system, the method further comprising determining an additional property of the specimen with a second system and determining a relationship between the property and the additional property.

18. The method of claim 1, further comprising, subsequent to said determining, processing the specimen, determining an additional property of the specimen subsequent to said processing, and determining a relationship between the property and the additional property.

19. The method of claim 1, wherein said measuring comprises measuring the parameter with a probe having a tip, and wherein a radius of the tip can be reproducibly controlled.

* * * * *